(12) United States Patent
Lee

(10) Patent No.: US 8,519,427 B2
(45) Date of Patent: Aug. 27, 2013

(54) LIGHT EMITTING DEVICE AND LIGHTING SYSTEM

(75) Inventor: Gun Kyo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/206,293

(22) Filed: Aug. 9, 2011

(65) Prior Publication Data

US 2011/0303941 A1    Dec. 15, 2011

(30) Foreign Application Priority Data

Aug. 9, 2010 (KR) ........................ 10-2010-0076419

(51) Int. Cl.
*H01L 33/00* (2010.01)

(52) U.S. Cl.
USPC .................................... 257/99; 257/E33.066

(58) Field of Classification Search
USPC ....... 257/79, 98, E33.001, E33.062, E33.059, 257/E23.061, E23.001, E21.499, 768
See application file for complete search history.

(56) References Cited

U.S. PATENT DOCUMENTS

| | | | | |
|---|---|---|---|---|
| 7,291,866 B2* | 11/2007 | Oshio et al. | ...................... | 257/99 |
| 7,332,802 B2* | 2/2008 | Konno | ........................... | 257/690 |
| 7,687,823 B2* | 3/2010 | Amo et al. | ...................... | 257/99 |
| 8,030,762 B2* | 10/2011 | Lee et al. | ....................... | 257/717 |
| 2004/0159850 A1 | 8/2004 | Takenaka | | |
| 2005/0063187 A1 | 3/2005 | Weng et al. | | |
| 2006/0124953 A1* | 6/2006 | Negley et al. | ................... | 257/99 |
| 2006/0125716 A1 | 6/2006 | Wong et al. | | |
| 2006/0220196 A1* | 10/2006 | Oshima | ........................ | 257/676 |
| 2006/0246617 A1* | 11/2006 | Lee et al. | ....................... | 438/26 |
| 2007/0145255 A1* | 6/2007 | Nishikawa et al. | ........... | 250/239 |
| 2007/0221928 A1* | 9/2007 | Lee et al. | ........................ | 257/79 |
| 2008/0224161 A1 | 9/2008 | Takada | | |
| 2009/0206358 A1* | 8/2009 | Chen et al. | ...................... | 257/99 |
| 2010/0193815 A1* | 8/2010 | Jaeger et al. | ..................... | 257/98 |
| 2010/0270571 A1* | 10/2010 | Seo | ................... | 257/98 |
| 2011/0284882 A1* | 11/2011 | An | ................... | 257/88 |

FOREIGN PATENT DOCUMENTS

| | | | |
|---|---|---|---|
| EP | 2034529 A2 | 3/2009 | |
| EP | 2418700 A2 | 2/2012 | |
| EP | 2418702 A2 | 2/2012 | |
| JP | 2003-243719 A | 8/2003 | |
| JP | 2005-535135 A | 11/2005 | |
| JP | 2006-173604 A | 6/2006 | |
| JP | 2006-339224 A | 12/2006 | |
| JP | 2007-150228 A | 6/2007 | |
| JP | 2007-19517 A | 8/2007 | |
| JP | 2008-227166 A | 9/2008 | |
| JP | 2010-114387 A | 5/2010 | |
| KR | 10-2007-0063313 A | 6/2007 | |
| KR | 10-2010-0028136 A | 3/2010 | |
| KR | 10-2010-0092695 A | 8/2010 | |
| WO | WO 2004/015769 A1 | 2/2004 | |

OTHER PUBLICATIONS

JP 2010114387 English translation (reference cited in IDS).*

* cited by examiner

*Primary Examiner* — Matthew Landau
*Assistant Examiner* — Latanya N Crawford
(74) *Attorney, Agent, or Firm* — Birch Stewart Kolasch & Birch, LLP

(57) ABSTRACT

Provided are a light emitting device and a lighting system having the same. The light emitting device includes: a plurality of metal layers spaced to each other; a first insulation film disposed on an outer part of a top surface area of the plurality of metal layers and having an open area where a portion of top side of the plurality of metal layers is opened; a light emitting chip disposed on at least one of the plurality of metal layers and electrically connected to other metal layers; and a resin layer on the plurality of metal layers and the light emitting chip.

5 Claims, 25 Drawing Sheets

(a)

(b)

US 8,519,427 B2

LIGHT EMITTING DEVICE AND LIGHTING SYSTEM

CROSS-REFERENCE TO RELATED APPLICATIONS

The present application claims priority under 35 U.S.C. 119 and 35 U.S.C. 365 to Korean Patent Application No. 10-2010-76419 filed on Aug. 9, 2010, which is hereby incorporated by reference in its entirety.

BACKGROUND

Embodiments relate to a light emitting device and a lighting system having the same.

Light emitting diodes (LEDs) are a kind of semiconductor device for converting electrical energy into light. Such an LED has advantages such as low power consumption, a semi-permanent life cycle, a fast response time, safety, and environment friendly compared to the related art light source such as a phosphor lamp and an incandescent bulb. Many studies are being in progress in order to replace the existing light sources with LEDs. Also, the LEDs are being increasingly used according to the trend as light sources of a variety of lamps used in indoor and outdoor places and lighting devices such as liquid crystal display devices, scoreboards, and streetlamps.

SUMMARY

Embodiments provide a new type light emitting device and a lighting system including the same.

Embodiments also provide a light emitting device that includes an insulation film to support a plurality of metal layers and a light emitting chip electrically connected to the plurality of metal layers.

Embodiments also provide a light emitting device having a cavity structure where an inner part of a metal layer is deeper than an outer part thereof and a lighting system including the same Embodiments also provide a light emitting device including a guide member around a light emitting chip and a resin layer therein and a lighting system including the same In one embodiment, a light emitting device includes: a plurality of metal layers spaced to each other; a first insulation film disposed on an outer part of a top side area of the plurality of metal layers and having an open area where a portion of top side of the plurality of metal layers is opened; a light emitting chip disposed on at least one of the plurality of metal layers and electrically connected to other metal layers; and a resin layer on the plurality of metal layers and the light emitting chip, wherein the plurality of metal layers include an inner part and an outer part, and the outer part has a thicker thickness than that of an inner part.

In another embodiment, a light emitting device includes: a plurality of metal layers spaced from each other; a first insulation film having an open area where a portion of top side of the plurality of metal layers is open and attached on a top side of the plurality of metal layers; a light emitting chip disposed on at least one of the plurality of metal layers and electrically connected to other metal layers; a resin layer disposed on the plurality of metal layers and the light emitting chip; and a first guide member of a metal material disposed on at least one of the first insulation film and the plurality of metal layers, wherein lower surfaces of the plurality of metal layers are disposed on the same plane; and the plurality of metal layers include an inner part and an outer part, and the outer part has a thicker thickness outer part than that of an inner part.

In further another embodiment, a light emitting device includes: a plurality of metal layers spaced from each other; a first insulation film having an open area where a portion of top side of the plurality of metal layers is open and disposed around a top side of the plurality of metal layers; an adhesive layer between the plurality of metal layers and the first insulation film; a second insulation film corresponding to between the plurality of metal layers and having a wider width than an interval between the plurality of metal layers, on a top side of the plurality of metal layers; a light emitting chip disposed on at least one of the plurality of metal layers; a resin layer disposed on the plurality of metal layers and the light emitting chip; and a first guide member disposed around a top side area of the first insulation film, wherein the plurality of metal layers have a cavity structure where an inner part has a deeper depth than an that of outer part.

The details of one or more embodiments are set forth in the accompanying drawings and the description below. Other features will be apparent from the description and drawings, and from the claims.

DETAILED DESCRIPTION OF THE EMBODIMENTS

Figure 1:
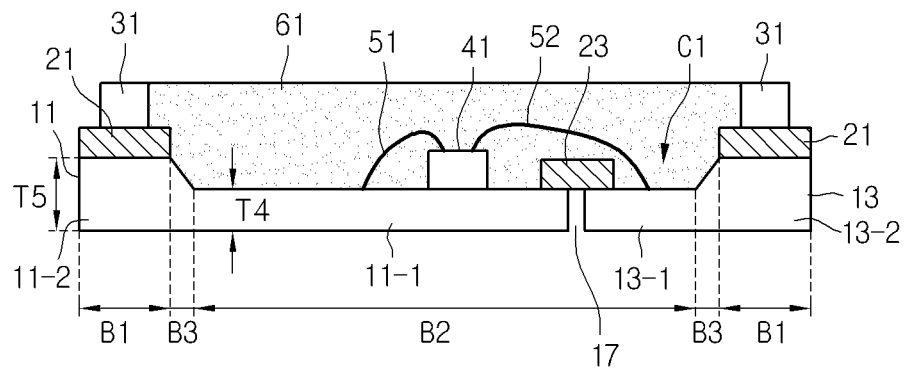
FIG. 1 is a cross-sectional view of a light emitting device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

FIG. 1 is a cross-sectional view illustrating a light emitting device according to a first embodiment.

Referring to FIG. 1, the light emitting device includes a plurality of metal layers 11 and 13, insulation films 21 and 23 on the metal layers 11 and 13, a light emitting chip 41 on at least the metal layer 11 between the plurality of metal layers 11 and 13, a guide member 31 on the insulation film 21, and a resin layer 61 on the metal layers 11 and 13 to cover the light emitting chip 41.

The metal layers 11 and 13 are spaced from each other by a separation part 17, and the separation part 17 may be an empty area or may be formed of an insulation adhesive material. The separation part 17 physically separates the metal layers 11 and 13 to prevent an electrical short between the metal layers 11 and 13.

The metal layers 11 and 13 do not use an additional main body, for example, a structure fixing a metal layer with a main body formed of a resin series such as Polyphthalamide (PPA), so that a portion of the metal layers 11 and 13 may have a curved shape, may be bent at a predetermined angle, or may be partially etched.

The metal layers 11 and 13 have respectively different thicknesses according to an area. An inner part area B2 of the metal layers 11 and 13 may have a thinner thickness than an outer part area B1. An area B3 between the inner part area B2 and the outer part area B1 of the metal layers 11 and 13 is a slant area, so thereby providing inclined planes with respect to at least two sides of the light emitting chip 41.

An inner part 11-1 of the first metal layer 11 and an inner part 13-1 of the second metal layer 13 are disposed more inside than the outer parts 11-2 and 13-2 with respect to the light emitting chip 41. The thicknesses T5 of the outer parts 11-2 and 13-2 in the metal layers 11 and 13 may be thicker than those T4 of the inner parts 11-1 and 13-1 in the metal layers 11 and 13. The thicknesses T4 of the inner parts 11-1 and 13-1 in the metal layers 11 and 13 may be in a range of about 15 µm to about 300 µm. This thickness may be preferably in a range of about 15 µm to about 50 µm. Also, the thickness may serve as a supporting frame for supporting the entire light emitting device and may serve as a heat radiation member for conducting a heat generated from the light emitting chip 41.

The inner part area B2 of the metal layers 11 and 13 may be formed by partially etching the thicknesses of the metal layers 11 and 13. During the partial etching process, an inclined area B3 having an inclined side may be formed between the inner part area B2 and the outer part area B1 of the metal layers 11 and 13. Seen from the top, the metal layers 11 and 13 may have a polygonal shape and the inner part area B2 may have a cavity C1 or a recess structure with a predetermined depth, different from the outer part region B1.

The outer part 11-2 of the first metal layer 11 is disposed around the inner part 11-1 and the outer part 13-2 of the second metal layer 13 is disposed around the inner part 13-1. The outer parts 11-2 and 13-2 of the first metal layer 11 and the second metal layer 13 are disposed around the inner parts 11-1 and 13-1 thereof. The inner part area B2 may have a cavity or a recess.

The inclined area B3 of the plurality of metal layers 11 and 13 has sides facing each other. An inclined angle of the inclined area B3 is about 15° to about 89° from the top side of the inner parts 11-1 and 13-1 of the metal layers 11 and 13.

The inclined side of the inclined area B3 is a reflective surface and is inclined to the side of the light emitting chip 41, so thereby effectively reflecting light.

The plurality of metal layers 11 and 13 may be formed of Fe, Cu, an alloy containing Fe such as Fe—Ni, Al, an alloy containing Al, or an alloy containing Cu such as Cu—Ni and Cu—Mg—Sn. The metal layers 11 and 13 may be formed of a single or multilayer metal. A reflective layer or a bonding layer formed of Al, Ag, or Au may be formed on the top side or/and the lower side of the metal layers 11 and 13.

If the metal layers 11 and 13 are realized with a lead frame, mechanical strength is strong, a coefficient of thermal expansion is large, processability is excellent, almost no loss occurs when a bending operation is repeated, and plating and soldering are easy.

The first insulation film 21 may be formed on the outer parts 11-2 and 13-2 of the metal layers 11 and 13 and a guide member may be formed on the first insulation film 21. The first insulation film 21 may be formed with the same width as the outer part parts 11-2 and 13-2, that is, the outer part area B5. The first insulation film 21 may have a frame shape, a ring shape, or a loop shape so that it may be adhered along the top sides of the outer parts 11-2 and 13-2 of the metal layers 11 and 13. Here, the first insulation film 21 may be adhered with an adhesive layer or directly adhered.

The lower side of the first insulation film 21 may be disposed higher than that of the light emitting chip 41, so that it may be disposed around the light emitting chip 41.

The light emitting chip 41 and the second insulation film 23 may be formed on the inner part B2 of the metal layers 11 and 13. The second insulation film 23 may correspond to a separation part 17 between the metal layers 11 and 13 and may be disposed on the top side or/and the lower side of the meal layers 11 and 13. The lower side of the second insulation film 23 may be disposed collinear to the lower side of the light emitting chip 41.

The second insulation film 23 and the first insulation film 21 prevent a twist between the metal layers 11 and 13 and maintain an interval between the metal layers 11 and 13. The second insulation film 23 and the first insulation film 21 may serve as a main body or a holder to fix the metal layers 11 and 13.

Although not shown in the drawings, each inner surface of at least one of the first insulation film 21 and the guide member 31 on the outer parts 11-2 and 13-2 of the metal layers 11 and 13 may have a structure inclined along an inclined angle of the inclined area B3 of the metal layers 11 and 13.

The insulation films 21 and 23 include a light-transmitting or non-light-transmitting film and, for example, may include a polyimide (PI) film, a polyethylene terephthalate (PET) film, an ethylene vinyl acetate (EVA) film, a polyethylene naphthalate (PEN) film, a tree acetyl cellulose (TAC) film, a polyamide-imide (PAI) film, a polyether-ether-ketone (PEEK) film, a perfluoroalkoxy (PFA) film, a polyphenylene sulfide (PPS), and a resin film such as PE, PP, and PET.

An adhesive layer may be formed between the insulation films 21 and 23 and the metal layers 11 and 13 and may attach the insulation films 21 and 23 to the metal layers 11 and 13. Or, the insulation films 21 and 23 may include a double-sided or single-sided adhesive tape.

The insulation films 21 and 23 may have a predetermined reflectance, for example, a reflectance of more than about 30% and this reflection characteristic may improve surface reflection efficiency in a device.

Additionally, the insulation films 21 and 23 may include an optical function. Here, the optical function includes a light-transmitting film having a transmittance of more than about 50% and may preferably include a light-transmitting film having a transmittance of more than about 70%. The insulation films 21 and 23 may include a phosphor substance. The phosphor substance may be applied on the top side or the lower side of the insulation films 21 and 23 or may be added therein. Kinds of the phosphor substance may include at least one of YAG based, silicate based, and nitride based phosphor substances and its emission wavelength may include visible ray series such as red, yellow, and green. Or, the insulation films 21 and 23 may be realized with a phosphor film and the phosphor film absorbs a light emitted from the light emitting chip 41 to emit a light of another wavelength.

Additionally, the insulation films 21 and 23 may include a moisture resistance film. The moisture resistance film suppresses moisture penetration, so thereby preventing oxidation and an electrical short between the first metal layer 11 and the second metal layer 13.

A portion of the top side, the lower side, or the outer side of the insulation films 21 and 23 may have a predetermined uneven structure but is not limited thereto.

The insulation films 21 and 23 may have thicknesses, which are at least as thick as or thicker than those of the metal layers 11 and 13. For example, the insulation films 21 and 23 may be formed with a thickness of about 30 μm to about 50 μm and may be preferably formed with a thickness of about 40 μm to about 60 μm.

The insulation films 21 and 23 may be divided into the first insulation film 21 around the two metal layers 11 and 13 and the second insulation film 23 around the top side in an interface area between the first metal layer 11 and the second meal layer 13. The second insulation film 23 extends from the first insulation film 11 and may be realized with a single film.

The guide member 31 may be formed on the first insulation film 21 and its material may be a resin material such as a solder resist and a conductive material such as a solder paste. The solder resist may have white color which may effectively reflect an incident light. Additionally, the guide member 31 may selectively include a high reflective material such as Ag, Al, Cu, Au, Ag-alloy, Al-alloy, Cu-Alloy, and Au-Alloy. This reflective material may be formed of a single or multi layer. The guide member 31 may be formed through a plating process using a reflective metal on a metal seed layer, for example, a material such as Ag, Al, and Ni.

Additionally, the guide member 31 may include a non-metallic material. The non-metallic material may include a white resin, for example, a resin (for example, PPA) including at least one of a solder resist, $TiO_2$, and glass fiber, a polymeric material (such as silicon series and epoxy series), or a material of the insulation film.

The guide member 31 may include a metallic or non-metallic material having a reflectance of more than about 50% and may preferably include a material having a reflectance of more than about 90%.

The guide member 31 may be formed with a thickness of about 15 μm to about 500 μm and the thickness may be identical to or different from those of the insulation films 21 and 23. The thickness of the guide member 31 may be changed in consideration of an optical orientation angle distribution. Additionally, the top side of the guide member 31 may be formed higher than the top side of the light emitting chip 41.

The guide member 31 is formed on the first insulation film 21 to cover the circumference of the light emitting chip 41 and its shape may be a ring, seen from the top. The guide member 31 may be a circular or polygonal guide ring and may prevent an overflow of the resin layer 61.

The width of the guide member 31 may be formed different from that of the first insulation film 21. If the widths of the guide member 31 and the first insulation film 21 are identical, surface reflection efficiency may be improved. If the widths of the guide member 31 and the first insulation film 21 are different, the guide member 31 may be stably disposed on the first insulation film 21.

If the guide member 31 has electrical conductivity, it may be disposed on the top side of the first insulation film 21 and a part of it may contact one of the two lead frames 11 and 13. Furthermore, if the guide member 31 is formed of an insulation material having no electrical conductivity, it may extend from the top side of the first insulation film 21 to the top sides of the metal layers 11 and 13.

Figure 2:
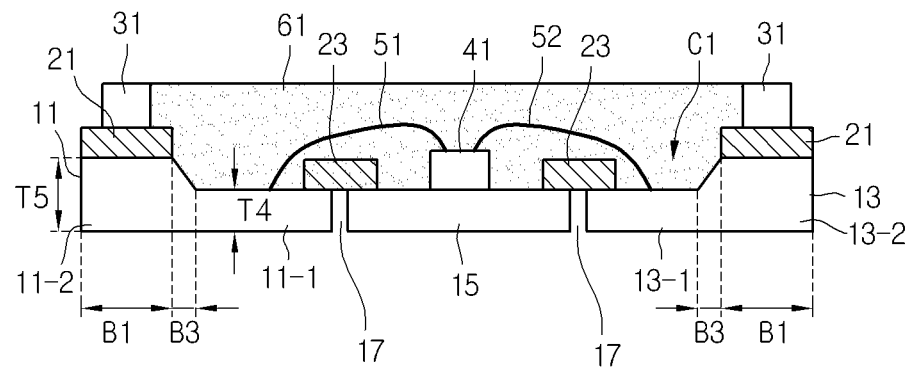
FIGS. 2 to 4 are views illustrating another example of the light emitting device of FIG. 1.
Figure 3:
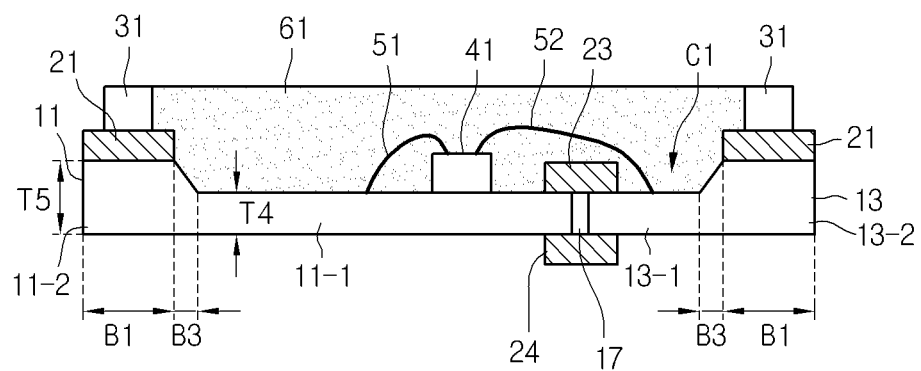
Figure 4:
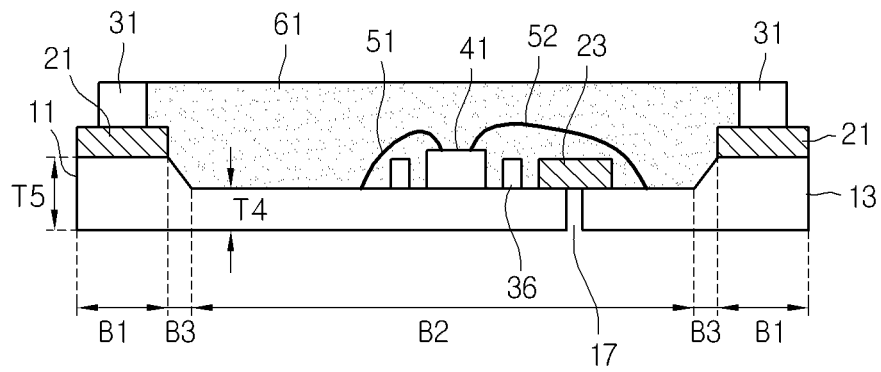

FIGS. 2 to 4 are views illustrating modifications of the light emitting device of FIG. 1.

Referring to FIG. 2, in relation to the light emitting device, a second insulation film 23 is disposed around a light emitting chip 41. The light emitting chip 41 is mounted on a first metal layer 11 through a hole of the second insulation film 23.

Referring to FIG. 3, in relation to a light emitting device, an insulation adhesive film 24 is further disposed below a plurality of metal layers 11 and 13 to support between the plurality of metal layers 11 and 13.

Referring to FIG. 4, in relation to the light emitting device, a first guide member 31 is disposed on a first insulation film 21 and a second guide member 36 is further disposed around the light emitting chip 41. The second guide member 36 serves as a reflective member to effectively emit a light emitted toward the side of the light emitting chip 41. The second guide member 36 may be formed of the same or different material than the first guide member 31. The second guide member 36 is attached on the first metal layer 36 and may be closer to the light emitting chip 41 than the second insulation film 23. That is, the second guide member 36 may be disposed between the light emitting chip 41 and the second insulation film 23. The inner side of the second guide member 36 may be vertical or inclined to the top side of the metal layer.

The structure having a thickness difference and an inclined side of each metal layer disclosed in the first embodiment may be applied to a metal layer in another embodiment described below and is not limited to the first embodiment.

Figure 6:
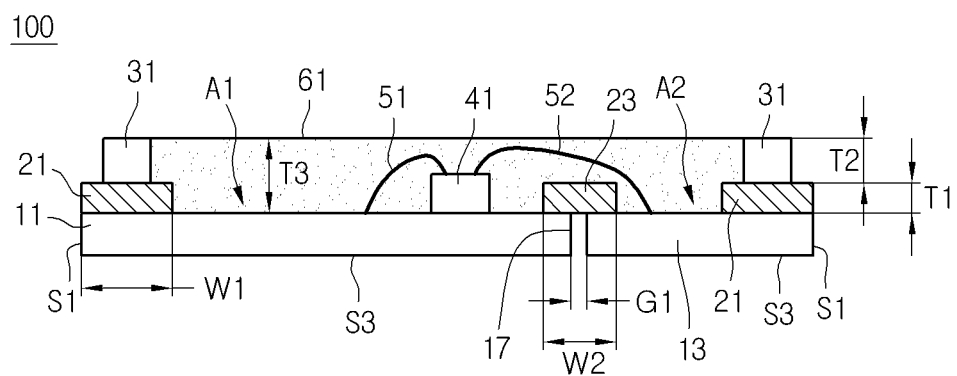
FIG. 6 is a sectional view taken along the line A-A of FIG. 5.
Figure 7:
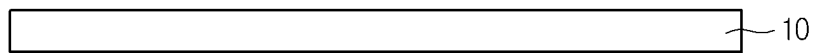
FIGS. 7 to 14 are views illustrating a manufacturing process of the light emitting device of FIG. 5.

FIG. 6 is a perspective view illustrating a light emitting device according to a second embodiment. FIG. 7 is a sectional view taken along the line A-A.

Referring to FIGS. 6 and 7, the light emitting device 100 includes a plurality of metal layers 11 and 13, an insulation film 20 including 21 and 23 on the metal layers 11 and 13, a light emitting chip on the first metal layer 11 between the plurality of metal layers 11 and 13, a guide member 31 on the insulation film 21, and a resin layer 61 on the metal layers 11 and 13 to cover the light emitting chip 41.

The metal layers 11 and 13 may include at least two layers and at least two metal layers 11 and 13 are spaced from each other to be electrically open or physically spaced. The metal layer 11 and 13 may be formed of a metal plate such as a lead frame.

The lower sides S3 of the plurality of metal layers 11 and 13 are disposed on the same plane and all sides S1 are exposed. Heat radiation efficiency may be improved through the exposed lower side S3 and sides S1 of the metal layers 11 and 13. At least two of the plurality of metal layers 11 and 13 may be used as electrodes.

The plurality of metal layers 11 and 13 may be formed of Fe, Cu, an alloy containing Fe such as Fe—Ni, Al, an alloy containing Al, or an alloy containing Cu such as Cu—Ni and Cu—Mg—Sn. The metal layers 11 and 13 may be formed of a single or multilayer. The metal layers 11 and 13 are formed of Fe or Cu. A reflective layer or a bonding layer formed of Al, Ag, or Au may be formed on the top side or/and the lower side of the metal layers 11 and 13.

If the metal layers 11 and 13 are realized with a lead frame, mechanical strength is strong, a coefficient of thermal expansion is large, processability is excellent, almost no loss occurs when a bending operation is repeated, and plating and soldering are easy.

The metal layers 11 and 13 may be formed with a thickness of about 15 μm to about 300 μm and the thickness may be preferably in a range of about 15 μm to about 50 μm. The metal layers 11 and 13 may serve as a supporting frame for supporting an entire light emitting device and also may serve as a heat radiation member for conducting a heat generated from the light emitting chip 41. In relation to an outer area of the metal layers 11 and 13, a length Y1 in a first direction Y and a length X1 in a second direction X orthogonal to the first direction Y may vary according to a size of the light emitting device.

The light emitting device 100 does not require an additional main body, for example, a resin based main body such as polyphthalamide (PPA). Accordingly, injection and molding processes for bonding the metal layers 11 and 13 with the main body may be unnecessary. A portion of the metal layers 11 and 13 may have a flexible curved shape or may be bent at a predetermined angle, but is not limited thereto.

Hereinafter, in order to describe the first embodiment, the metal layers 11 and 13 include the first metal layer 11 and the second metal layer 13. The lower sides S3 of the first metal layer 11 and the second metal layer 13 are disposed on the same plane and may be bonded on a board (PCB) or a heat radiation plate through solder.

A separation part 17 is disposed between the first metal layer 11 and the second metal layer 13. The separation part 17 may physically separate the first metal layer 11 from the second metal layer 13. The separation part 17 may selectively have one of a straight line shape, a curved line shape, and a bending line shape. The width or form of the line may vary according to the shapes or sizes of the first metal layer 11 and the second metal layer 13. The separation part 17 separate one metal frame into the first metal layer 11 and the second metal layer. According to the width and position of the separation part 17, the shapes or sizes of the first metal layer 11 and the second metal layer 13 may vary.

An interval G1 between the first metal layer 11 and the second metal layer 13 may be more than about 10 μm and this interval as a width of the separation part 17 is a distance for preventing an electrical short or electrical interference between two metal layers 11 and 13. The separation part 17 may be an empty area or may be filled with an insulation material, but is not limited thereto.

The first metal layer 11 or the second metal layer 13 may have various shapes such as a circular shape, a polygonal shape, and a hemispherical shape, through a cutting process.

An oxidation preventing coating layer may be formed on the surface of the first metal layer 11 and the second metal layer 13. The oxidation preventing coating layer may prevent surface deterioration of the first metal layer 11 and the second metal layer 13.

Insulation films 21 and 23 are disposed on the first metal layer 11 and the second metal layer 13 and the insulation films 21 and 23 may be formed around the first metal layer 11 or/and the second metal layer 13.

The insulation films 21 and 23 are attached on the top surface of the first metal layer 11 and the second metal layer 13, so thereby supporting the first metal layer 11 and the second metal layer 13. The insulation films 21 and 23 are attached on the top side of the plurality of metal layers 11 and 13 and may serve as a substantial main body.

The insulation films 21 and 23 include a light-transmitting or non-light-transmitting film and for example, may include a polyimide (PI) film, a polyethylene terephthalate (PET) film, an ethylene vinyl acetate (EVA) film, a polyethylene naphthalate (PEN) film, a tree acetyl cellulose (TAC) film, a polyamide-imide (PAI) film, a polyether-ether-ketone (PEEK) film, a perfluoroalkoxy (PFA) film, a polyphenylene sulfide (PPS), and a resin film such as PE, PP, and PET.

An adhesive layer may be formed between the insulation films 21 and 23 and the metal layers 11 and 13 and may attach the insulation films 21 and 23 to the metal layers 11 and 13. Or, the insulation films 21 and 23 may include a double-sided or single-sided adhesive tape.

The insulation films 21 and 23 may have a predetermined reflectance, for example, a reflectance of more than about 30% and this reflection characteristic may improve surface reflection efficiency in a device.

Additionally, the insulation films 21 and 23 may include an optical function. Here, the optical function includes a light-transmitting film having a transmittance of more than about 50% and may preferably include a light-transmitting film having a transmittance of more than about 70%. The insulation films 21 and 23 may include a phosphor substance. The phosphor substance may be applied on the top side or the lower side of the insulation films 21 and 23 or may be added therein. Kinds of the phosphor substance may include at least one of YAG based, silicate based, and nitride based phosphor substances and its emission wavelength may include visible ray series such as red, yellow, and green. Or, the insulation films 21 and 23 may be realized with a phosphor film and the phosphor film absorbs the light emitted from the light emitting chip 41 to emit a light of another wavelength.

Additionally, the insulation films 21 and 23 may include a moisture resistance film. The moisture resistance film suppresses moisture penetration, so thereby preventing oxidation and an electrical short of emit light of another the first metal layer 11 and the second metal layer 13.

A portion of the top side, the lower side, or the outer side of the insulation films 21 and 23 may have a predetermined uneven structure but is not limited thereto.

The insulation films 21 and 23 may have a thicker thickness than the metal layers 11 and 13. For example, the thickness of the insulation films 21 and 23 may be formed with a thickness of about 30 μm to about 500 μm and may be preferably formed with a thickness of about 40 μm to about 60 μm.

The insulation films 21 and 23 may be divided into the first insulation film 21 around the top area of the two metal layers 11 and 13 and the second insulation film 23 around the top side in an interface area between the first metal layer 11 and the second meal layer 13. The second insulation film 23 is integrally connected to the first insulation film 21 as a part of the first insulation film 21. The first insulation film 21 and the second insulation film 23 may include the same material and may be formed of one film.

The width W1 of the first insulation film 21 may be uniform or may be partially different. The width W1 of the first insulation film 21 may be at least more than several tens μm. The width W2 of the second insulation film may be uniform or partially different. The width W2 of the second insulation film 23 may be wider than the interval G1 between the metal layers 11 and 13, for example, may be more than 20 μm. The width W1 of the first insulation film 21 and the width W2 of the second insulation film 23 may be the same or different. The second insulation film 23 may have a width of at least more than 20 µm to support the two metal layers 11 and 13.

The second insulation film 23 corresponds to between the first metal layer 11 and the second metal layer 13 and may be formed on the top side of the first metal layer 11 and the second metal layer 13 with a width wider than the interval between the metal layers 11 and 13.

The outer side of the insulation films 21 and 23 may be disposed on the same plane as the sides of the first metal layer 11 and the second metal layer 13 or may be disposed more inside than the side of the first metal layer 11 and the second metal layer 13.

Additionally, the first insulation film 21 may be continuously or discontinuously formed. The continuous film structure includes one film and the discontinuous film structure includes a plurality of films.

The insulation films 21 and 23 may include open areas A1 and A2. The open areas A1 and A2 are holes or areas through which the top side of the first metal layer 11 or/and the second metal layer 13 are exposed through the inner side of the insulation films 21 and 23.

The open areas A1 and A2 include a first open area A1 through which a portion of the top side of the first metal layer 11 is exposed and a second open area A2 through which a portion of the top side of the second metal layer 13 is exposed. The size and shape of the first open area A1 may be the same or different than that of the second open area A2. In this embodiment, the two open areas A1 and A2 are described with the two metal layers 11 and 13. If the number of metal layers 11 and 13 is more than three, the number of open areas may be increased. The size and shape of the open areas A1 and A2 may vary according to the width and shape of the insulation films 21 and 23.

One of the plurality of open areas A1 and A2, for example, the second open area A2, may be formed with the minimum width of about 60 µm. Since the second open area A2 hinders the bonding of the second wire 52 if it has a narrow width, the width may be at least about 60 µm. The first open area A1 may have a width on which the light emitting chip 41 is mounted and may have a wider width than that of the second open area A2. Here, although it is described that the first open area A1 is an area having the light emitting chip 41 mounted and the second open area A2 is an area where the second wire 52 is bonded, they may be oppositely displaced and are not limited thereto.

The guide member 31 may be formed on the first insulation film 21 and its material may include a resin material, a non-metallic material, or a metallic material. The guide member 31 may be defined as a dam member to prevent an overflow of a reflective member or/and a resin.

The guide member 31 may be a resin material such as a solder resist or may use a conductive material such as a solder paste. The solder resist may have white color which may effectively reflect an incident light. Additionally, the guide member 31 may selectively include a metallic material such as Ag, Al, Cu, Au, Ag-alloy, Al-alloy, Cu-Alloy, and Au-Alloy. This metallic material may be formed of a single or multilayer. Additionally, the guide member 31 may be formed through a plating process using a reflective layer on a metal seed layer, for example, a material such as Ag, Al, and Ni. The guide member 31 may be formed of a material having a higher reflectance than the first insulation film 21.

Additionally, the guide member 31 may include a non-metallic material. The non-metallic material may include a white resin, for example, a resin (for example, PPA) including at least one of solder resist, $TiO_2$, and glass fiber, a polymeric material (such as silicon series and epoxy series), or a material of the insulation film.

The guide member 31 may include a metallic or non-metallic material having a reflectance of more than about 50% and may preferably include a material having a reflectance of more than about 90%.

The guide member 31 may be formed with a thickness of about 15 µm to about 500 µm and the thickness may be identical to or different from the thickness of the insulation films 21 and 23. The thickness of the guide member 31 may be thicker than those of the insulation films 21 and 23. The thickness T2 of the guide member 31 may be further thicker in consideration of an optical orientation angle distribution. Additionally, the top side of the guide member 31 may be formed higher than the top side of the light emitting chip 41.

The guide member 31 is formed on the first insulation film 21 to correspond to the circumference of the light emitting chip 41. Seen from the top, the guide member 31 may have a frame, ring, or loop shape. Seen from the top, the guide member 31 may be a circular or polygonal shape and may prevent an overflow of the resin layer 61.

The width of the guide member 31 may be formed different from that of the first insulation film 21. If the widths of the guide member 31 and the first insulation film 21 are identical, surface reflection efficiency may be improved. If the width of the guide member 31 is narrower than that of the first insulation film 21, the guide member 31 may be stably disposed on the first insulation film 21. As the guide member 31 is formed along the first insulation film 21, an open area is provided.

If the guide member 31 has electrical conductivity, it may be disposed on the top side of the first insulation film 21 and a part of it may contact one of the plurality of metal layers 11 and 13. Additionally, when the guide member 31 is formed of an insulation material, it may contact the top side of the metal layers 11 and 13.

The light emitting chip 41 may be disposed on the first metal layer 11 and may be electrically connected to the first metal layer 11 and the second metal layer 13.

The light emitting chip 41 may be realized with a light emitting diode of a visible ray band to emit light such as red, green, blue, and white or a light emitting diode of an ultra violet band, but is not limited thereto.

The light emitting chip 41 may be realized with a lateral type chip having two electrodes displaced in parallel or a vertical type chip having two electrodes disposed at respectively opposite sides. The lateral type chip may be connected to at least two wires 51 and 52 and the vertical type chip may be connected to at least one wire (for example, 52).

The light emitting chip 41 may be bonded on the first metal layer 11 with a conductive or insulation adhesive. Here, when an electrode is disposed on the lower side of the light emitting chip 41, a conductive adhesive may be used and, when an insulation substrate is disposed on the lower side of the light emitting chip 41, a conductive adhesive or insulation adhesive may be used.

The light emitting chip 41 may be connected to the first metal layer 11 through the first wire 51 and may be connected to the second metal layer 13 through the second wire 52. Additionally, the light emitting chip 41 may be electrically connected to the first metal layer 11 and the second metal layer 13 through a flip chip method.

It is described that the light emitting chip 41 is disposed on the first metal layer 11. However, the light emitting chip 41 may be disposed on the first metal layer 11 and/or the second metal layer 13 and is not limited thereto.

Light emitting chip 41 may be connected to the first metal layer 11 through the first wire 51 and may be connected to the second metal layer 13 through the second wire 53. Here, the light emitting chip 41 may be formed with a thickness of more than about 80 μm and a peak point of one of the wires 51 and 52 may be formed higher by more than about 40 μm from the top side of the light emitting chip 41.

A phosphor layer may be coated on the surface of the light emitting chip 41 and may be formed on the top side of the light emitting chip 41.

Additionally, a protection device for protecting the light emitting chip 41 such as zener diode or a transient voltage suppressor (TVS) diode is disposed above or below at least one of the first metal layer 11 and the second metal layer 13, so that it may be electrically connected to the light emitting chip 41. The protection device is connected to the first and second metal layers 11 and 13 to be connected in parallel to the light emitting chip 41, so that it protects the light emitting chip 41 from an abnormal voltage applied to the light emitting chip 41. This protection device may not be provided.

The resin layer 61 may be disposed on the first metal layer 11 and the second metal layer 13 and a portion of it may be formed on the top side of the first insulation film 21. The resin layer 61 is disposed in an open area at an inner side of the guide member 31. The open area of the guide member 31 may be greater than the first and second open areas A1 and A2. The resin layer 61 covers an inner side area such as the first open area A1 and the second open area A2. The resin layer 61 may be physically and separately disposed on the respective first open area A1 and second open area A2.

The resin layer 61 may include a light-transmitting resin based material, for example, silicon or epoxy.

The resin layer 61 may be formed with a thickness T3 of about 80 μm to about 500 μm and may include a single layer or a multilayer. In a case of the multilayer, the lowermost layer may be formed with a thickness of less than 80 μm.

When the resin layer 61 is a multilayer, layers of the same or different material may be stacked, or layers are sequentially stacked from a layer of low hardness to a layer of high hardness, or layers are sequentially stacked from a layer of a high refractive index to a layer of a low refractive index.

A portion of the top side of the resin layer 61 may be formed lower than the top side of the guide member 31, or may be formed higher than the top side of the insulation films 21 and 23. Additionally, the resin layer 61 may be formed with a height to cover the wires 51 and 52, but is not limited thereto.

The resin layer 61 may include phosphor. The phosphor may include at least one phosphor of a visible ray band such as yellow, green, and red. The resin layer 61 may be divided into a light-transmitting resin layer and a phosphor layer and then may be stacked. A phosphor film, for example, a photo luminescent film (PLF) may be disposed above/below the resin layer 61, but is not limited thereto.

A lens may be formed on the resin layer 61 and may have a convex lens shape, a concave lens shape, and a convex and concave mixed lens shape. Additionally, the lens may contact on or may be spaced from the top side of the resin layer 61 but is not limited thereto.

Figure 5:
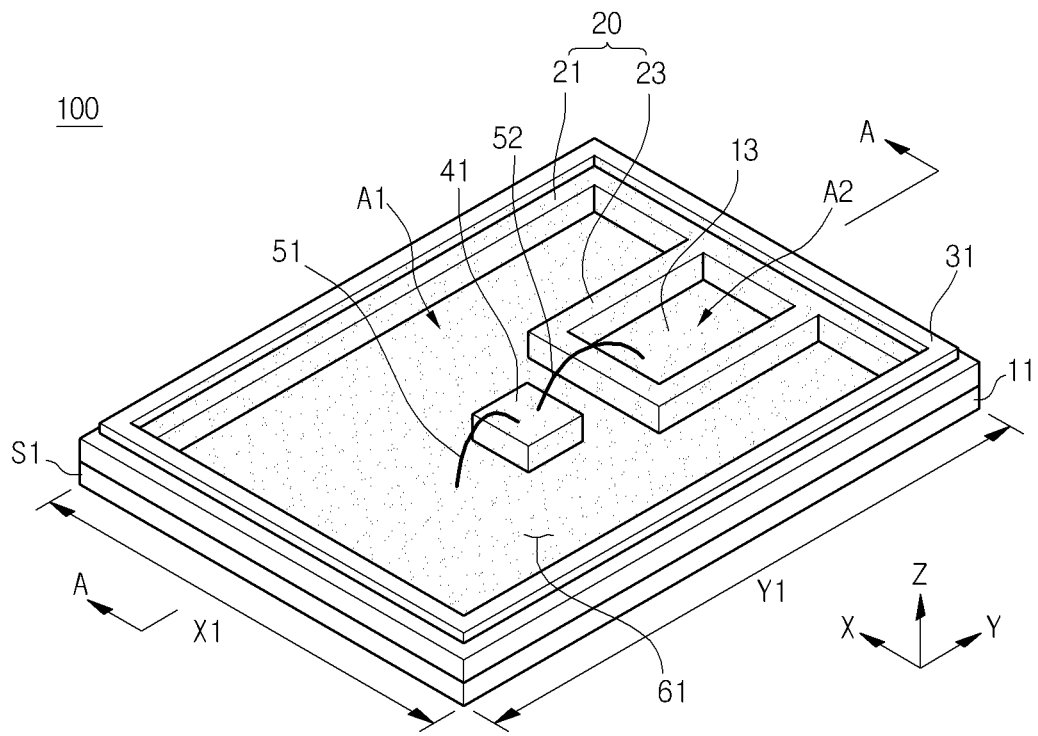
FIG. 5 is a perspective view of a light emitting device according to a second embodiment.

FIGS. 7 to 14 are views illustrating manufacturing processes of the light emitting device of FIG. 5.

Figure 8:
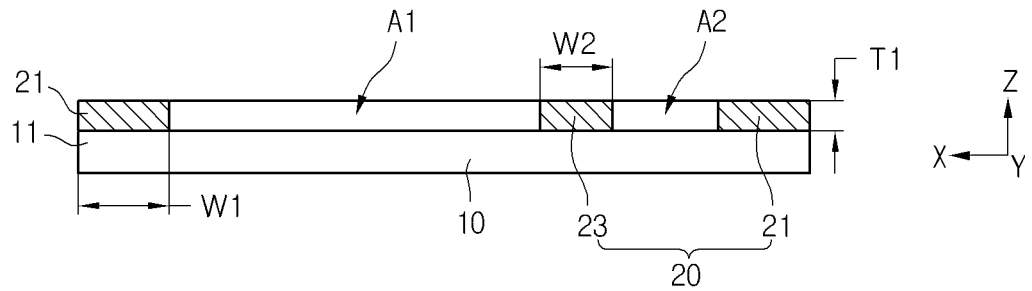

Referring to FIGS. 7 and 8, a metal layer 10 may be formed with a size for manufacturing one light emitting device of FIG. 5, a size of a bar shape for manufacturing a plurality of light emitting devices arrayed in a first direction (horizontal or vertical), or a size of a matrix shape for manufacturing a plurality of light emitting devices arrayed in horizontal and vertical directions. The metal layer 10 having the plurality of light emitting devices manufactured may be cut by an individual light emitting device or at least two light emitting devices. Hereinafter, for describing an embodiment, a metal layer for manufacturing one light emitting device will be used.

The metal layer 10 may be realized with a metal plate such as a lead frame and may be formed of Fe, Cu, an alloy containing Fe such as Fe—Ni, Al, an alloy containing Al, or an alloy containing Cu such as Cu—Ni and Cu—Mg—Sn. Additionally, the metal layer 10 may be formed of a single layer or multilayer metal. A reflective layer such or a bonding layer formed of Al, Ag, Au, or solder resist may be formed on the top side or/and the lower side of the metal layer 10. A plating process or a coating process of the metal layer 10 is performed before or after insulation films 21 and 23 are formed.

The metal layer 10 may be formed with a thickness of about 15 μm to about 300 μm and this thickness may serve as a supporting frame for supporting an entire light emitting device.

Since the metal layer 10 and an additional main body, for example, the main body of resin series such as polyphthalamide (PPA) is not formed through an injection molding process, a portion of the metal layer 10 may have a flexible curved shape or may be bent at a predetermined angle.

Figure 9:
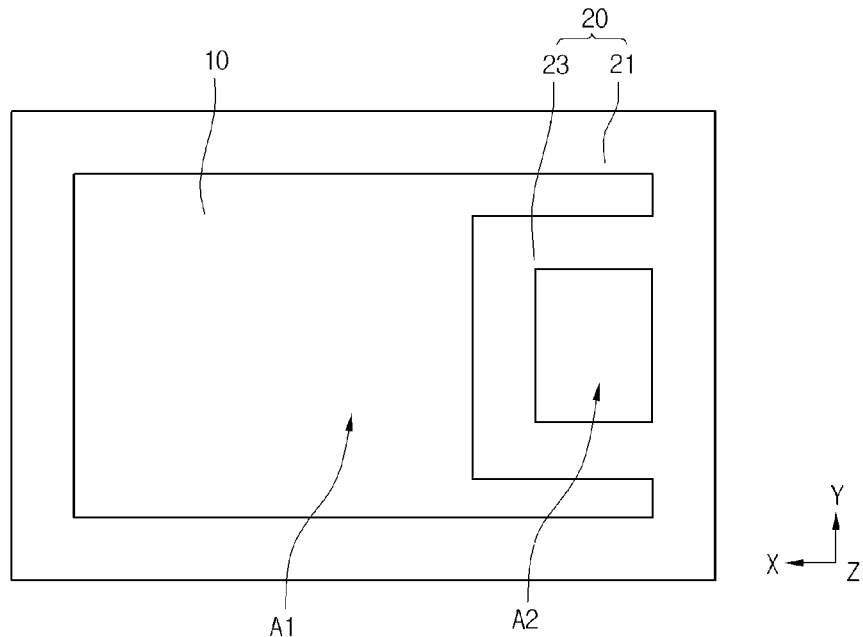

FIG. 9 is a cross-sectional view of FIG. 8.

Referring to FIGS. 8 and 9, an insulation film 20 including 21 and 23 is formed on the metal layer 10. The insulation film 20 including 21 and 23 may be formed with a thickness T1 of about 30 μm to about 500 μm an in a thickness direction of the metal layer 10. Additionally, the insulation film 20 may be formed thicker than the metal layers 11 and 13. Here, according to the embodiment, it is described that the insulation film 20 including 21 and 23 is attached on the metal layer 10. However, the metal layer 10 may be attached on the insulation film 20 including 21 and 23 and these manufacturing order may be interchangeable.

The insulation film 20 may be attached on the metal layer 10 after an adhesive layer is applied. The bonding process of the insulation films 21 and 23 may be performed at a predetermined temperature through a laminating process after the insulation films 21 and 23 are attached on the metal layer 10.

The insulation films 21 and 23 as an insulation film may selectively include films having an optical function, a thermal conductivity function, and a humidity resistance function. The insulation films 21 and 23 may include a polyimide (PI) film, a polyethylene terephthalate (PET) film, an ethylene vinyl acetate (EVA) film, a polyethylene naphthalate (PEN) film, a tree acetyl cellulose (TAC) film, a polyamide-imide (PAI) film, a polyether-ether-ketone (PEEK) film, a perfluoroalkoxy (PFA) film, a polyphenylene sulfide (PPS), and a resin film such as PE, PP, and PET.

The insulation films 21 and 23 may be formed of a film having an adhesive layer such as a double-sided or single-sided adhesive tape.

When the insulation films 21 and 23 are formed of a light-transmitting material, it may include a phosphor or/and a scattering substance. The phosphor or scattering substance may be applied on the surface of the insulation films 21 and 23 or be added therein.

The insulation films 21 and 23 may include a film type having a reflective characteristic of a predetermined reflectance, for example, a reflectance of more than about 30%.

After a plurality of open areas A1 and A2 are formed, the insulation films 21 and 23 may be attached on the metal layers 11 and 13. The open areas A1 and A2 may be holes in a single film or an area opened. The insulation films 21 and 23 are spaced from each other by the open areas A1 and A2. The insulation films 21 and 23 may be divided into a first insulation film 21 around the first open area A1 or around the metal layer 10 and a second insulation film 23 around the second open area A2. The second insulation film 23 as a portion of the first insulation film 21 may be integrally formed with the first insulation film 21. The first and second insulation films 21 and 23 may be realized with a single film.

The width W1 of the first insulation film 21 may be uniform or may be partially different. The width W1 of the first insulation film 21 may be at least more than several tens μm. The width W2 of the second insulation film may be uniform or partially different. The width W2 of the second insulation film 23 may be wider than the interval G1 between the metal layers 11 and 13, for example, may be more than 20 μm. The width W1 of the first insulation film 21 and the width W2 of the second insulation film 23 may be the same or different.

One of the plurality of open areas A1 and A2, for example, the second open area A2, may be formed with the minimum width of about 60 μm. This width may be formed in a range that does not hinder the bonding with a wire. The first open area A1 may be formed with a width on which a light emitting chip is mounted and may be formed with a wider width than that of the second open area A2. Here, the first open area A1 is described as an area having the light emitting chip mounted and the second open area A2 is described as an area on which a wire is bonded, but its opposite may be possible and is not limited thereto.

The first open area A1 and the second open area A2 may be an open area of a predetermined shape through a punching process, a cutting process, or an etching process on a single insulation film. The widths or shapes of the first open area A1 and the second open area A2 may vary. The open areas A1 and A2 may be formed after or before the insulation film 20 including 21 and 23 are attached on the metal layer 10.

The top side of the metal layer 10 may be exposed through the first open area A1 and the second open area A2 of the insulation films 21 and 23.

The insulation films 21 and 23 may be formed by printing another material, for example, an insulation material such as an oxide such as $Al_2O_3$, $SiO_2$, $SiO_x$, $SiO_xN_y$, or a nitride or coating an insulation material. In this case, the hardened insulation films 21 and 23 may be formed of a material having a certain flexibility or a predetermined viscosity.

A mesh or uneven shape may be formed or a plurality of fine holes may be further formed in an inner side or an inner predetermined area of the insulation film 21 and 23 but the present invention is not limited thereto.

Figure 10:
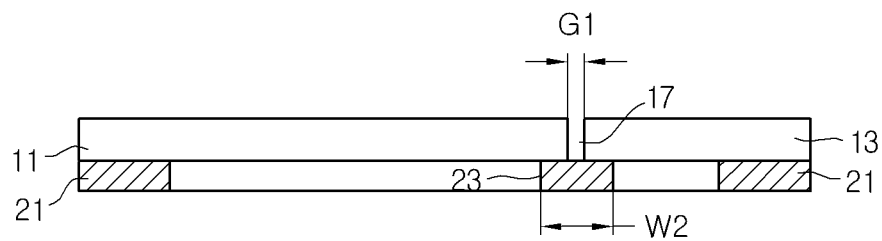
Figure 11:
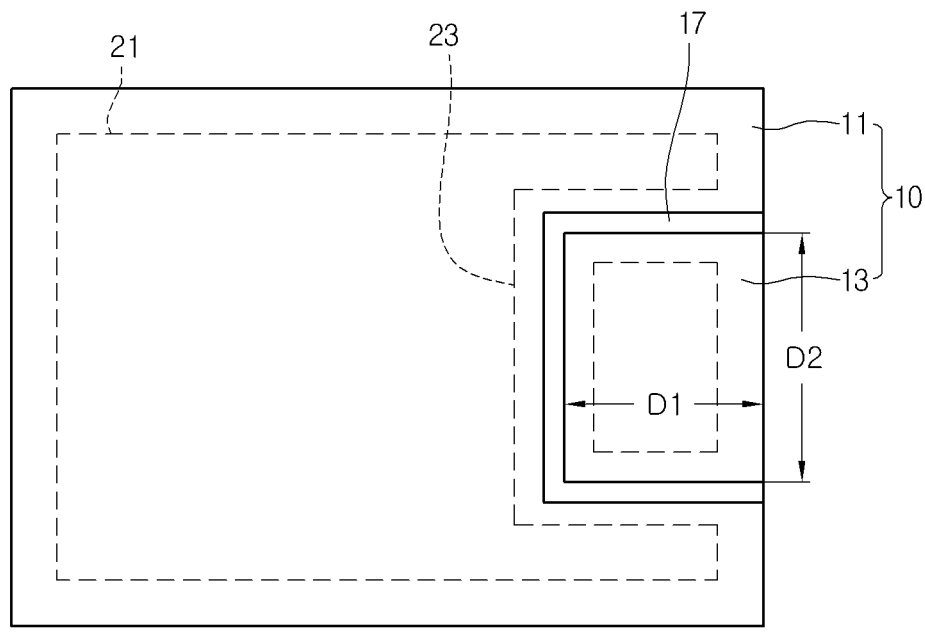

FIG. 11 is a plan view of FIG. 10.

Referring to FIGS. 10 and 11, the metal layer 10 of FIG. 8 may be divided into a plurality of metal layers 11 and 13. The plurality of metal layers 11 and 13 may include at least two layers which may be used as electrodes for supplying power.

Here, a circuit forming process of the metal layer includes activating the surface of the lead frame, applying a photo resist, performing an exposure process, and performing a developing process. Once the developing process is completed, a necessary circuit is formed through an etching process and then the photo resist is laminated. Then, a Ag plating process is performed on the surface of the metal layer to process the surface to be bonded.

The width of the first metal layer 11 may be the same or different than that of the second metal layer 13. For example, the size of the first metal layer 11 may be greater or less than that of the second metal layer 13. Or, the first metal layer 11 and the second metal layer 13 may be formed with the same area or a mutually symmetric shape.

The first metal layer 11 and the second metal layer 13 are spaced from each other by a predetermined separation part 17 and its interval G1 may be more than about 10 μm and may be narrower than the width W1 of the second insulation film 23.

The second insulation film 23 maintains the interval G1 between the first metal layer 11 and the second metal layer 13 and the first insulation film 21 supports the metal layers.

Here, the second metal layer 13 may extend into the inside through one side of the first metal layer 11 and the lengths D1 and D2 may vary according to the second open area A2 and the insulation films 21 and 23.

Figure 12:
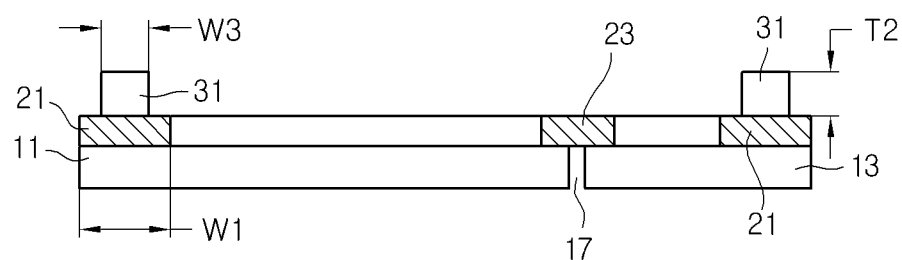

Referring to FIGS. 9 and 12, a guide member 31 is formed on the top side of the insulation films 21 and 23. The guide member 31 is formed through one of a printing method, a coating method, and a film adhesive method. In the printing method, a mask is used in an area except a portion to be printed and then, a screen print method is performed. In the coating method, a reflective material is applied on a desired area. In the film adhesive method, a film type such as a reflective sheet may be attached. Here, the materials of the guide member 31 and the insulation films 21 and 23 may be selected in consideration of thermal characteristics according to a wire bonding or reflow process.

The guide member 31 may be formed through a print method using a solder resist or a solder paste. The solder paste is white, so thereby effectively reflect an incident light. Additionally, the guide member 31 may selectively include a high reflective material such as Ag, Al, Cu, Au, Ag-alloy, Al-alloy, Cu-Alloy, and Au-Alloy and this reflective material may include a single layer or a multilayer. The guide member 31 may be formed through a plating process on a metal seed layer, for example, a material layer of Ag, Al, or Ni.

Additionally, the guide member 31 may include a non-metallic material. The non-metallic material may include a white resin, for example, a resin (for example, PPA) including a mixed $TiO_2$ and glass fiber. If the guide member 31 has insulating and reflective characteristics, no additional insulation film is necessary but the present invention is not limited thereto.

The guide member 31 may include a metallic or non-metallic material having a reflectance of more than about 50% and may preferably include a material having a reflectance of more than about 90%.

The guide member 31 may be formed with a thickness of about 15 μm to about 500 μm and the thickness may be the same or different than those of the insulation films 21 and 23. The thickness T2 and arrangement structure of the guide member 31 may vary in consideration of an optical orientation angle distribution.

The guide member 31 may be formed on the first insulation film 21 to cover the circumference of the light emitting chip 41. Seen from the top, its shape may be a frame shape, a loop shape, or a ring shape. The guide member 31 may be continuously or discontinuously formed on the top side of the first insulation film 21.

The width of the guide member 31 may be formed different from that of the first insulation film 21. If the widths of the guide member 31 and the first insulation film 21 are identical, surface reflection efficiency may be improved. If the width of the guide member 31 is different from that of the first insulation film 21, the guide member 31 may be stably disposed on the first insulation film 21.

If the guide member 31 has electrical conductivity, it may be disposed on the top side of the first insulation film 21. Its portion may contact one of two lead frames 11 and 13. Additionally, if the guide member 31 is formed of an insulation material, it may extend from the top side of the first insulation film 21 to the top sides of the metal layers 11 and 13.

Figure 13:
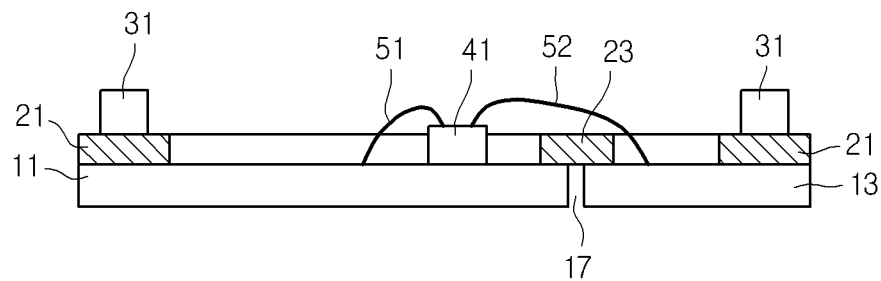

Referring to FIGS. 12 and 13, the light emitting chip 31 is disposed on the first metal layer 11 and may be electrically connected to the first metal layer 11 and the second metal layer 13.

The light emitting chip 41 may be realized with a light emitting diode of a visible ray band to emit a light such as red, green, blue, and white or a light emitting diode of an ultra violet band, but is not limited thereto.

The light emitting chip 41 may be realized with a lateral type chip having two electrodes displaced in parallel or a vertical type chip having two electrodes disposed at respectively opposite sides. The lateral type chip may be connected to at least two wires 51 and 52 and the vertical type chip may be connected to at least one wire (for example, 52).

The light emitting chip 41 may be adhered on the first metal layer 11 with a conductive or insulation adhesive. Here, when an electrode is disposed on the lower side of the light emitting chip 41, a conductive adhesive may be used and, when an insulation substrate is disposed on the lower side of the light emitting chip 41, a conductive adhesive or insulation adhesive may be used.

The light emitting chip 41 may be connected to the first metal layer 11 through the first wire 51 and may be connected to the second metal layer 13 through the second wire 52. Additionally, the light emitting chip 41 may be electrically connected to the first metal layer 11 and the second metal layer 13 through a flip chip method.

It is described that the light emitting chip 41 is disposed on the first metal layer 11. However, the light emitting chip 41 may be disposed on the first metal layer 11 and/or the second metal layer 13 and is not limited thereto.

The Light emitting chip 41 may be connected to the first metal layer 11 through the first wire 51 and may be connected to the second metal layer 13 through the second wire 53. Here, the light emitting chip 41 may be formed with a thickness of more than about 80 μm and a peak point of one of the wires 51 and 52 may be formed higher by more than about 40 μm from the top side of the light emitting chip 41.

Figure 14:
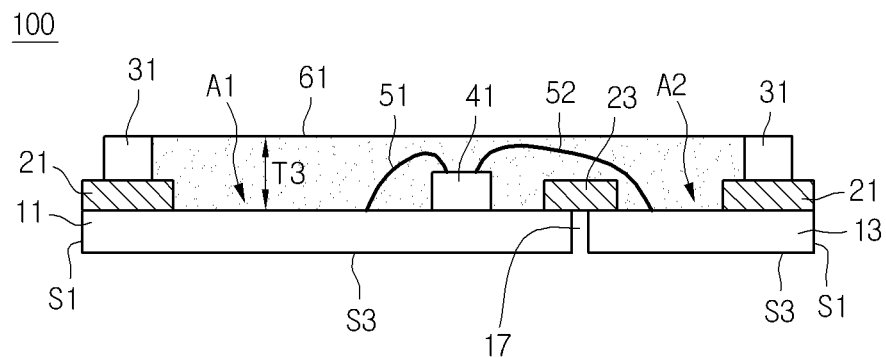

Referring to FIGS. 13 and 14, the resin layer 61 may include a light-transmitting resin based material, for example, silicon or epoxy.

The resin layer 61 may be formed with a thickness T3 of about 80 μm to about 500 μm and may include a single layer or a multilayer. In a case of the multilayer, the lowermost layer may be formed with a thickness of less than 80 μm.

When the resin layer 61 is a multilayer, layers of the same or different material may be stacked, or layers are sequentially stacked from a layer of low hardness to a layer of high hardness, or layers are sequentially stacked from a layer of a high refractive index to a layer of a low refractive index.

A portion of the top side of the resin layer 61 may be formed lower than the top side of the guide member 31, or may be formed higher than the top side of the insulation films 21 and 23. Additionally, the resin layer 61 may be formed with a height to cover the wires 51 and 52, but is not limited thereto.

The resin layer 61 may include phosphor. The phosphor may include at least one phosphor of a visible ray band such as yellow, green, and red. The resin layer 61 may be divided into a light-transmitting resin layer and a phosphor layer and then may be stacked. A phosphor film, for example, a photo luminescent film (PLF) may be disposed above/below the resin layer 61, but is not limited thereto.

The resin layer 61 covers an inner side area such as the first open area A1 and the second open area A2. The resin layer 61 may be physically and separately disposed on the respective first open area A1 and second open area A2.

A lens may be formed on the resin layer 61 and may have a convex lens shape, a concave lens shape, and a convex and concave mixed lens shape. Additionally, the lens may contact on or may be spaced from the top side of the resin layer 61 but is not limited thereto.

Figure 15:
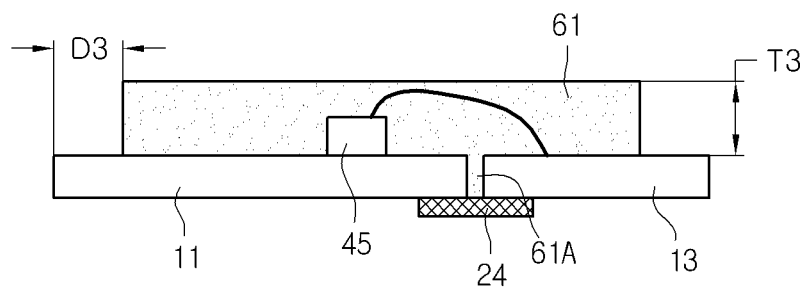
FIG. 15 is a cross-sectional view of a light emitting device according to a third embodiment.

FIG. 15 is a cross-sectional view illustrating a light emitting device according to a third embodiment.

Referring to FIG. 15, a light emitting chip 41 is bonded on the first metal layer 11 to be electrically connected to the first metal layer 11 and is connected to the second metal layer 13 through a wire 52.

An insulation film 24 may be attached below between the first metal layer 11 and the second metal layer 13. The insulation film 24 maintains an interval between the first metal layer 11 and the second metal layer with a predetermined value and supports between the first metal layer 11 and the second metal layer 13.

A resin layer 61 is formed on the first metal layer 11 and the second metal layer 13. The resin layer 61 may be injection-molded to have a predetermined shape through a transfer molding method. According to the transfer molding method, a liquid resin is filled in the frame having a predetermined shape and then hardened, so that the resin layer 61 having a desired shape may be formed. The shape of the resin layer 61 may further a cylindrical shape, a polygonal column shape, an uneven surface shape, or a concaved shape and is not limited thereto.

A portion 61A of the resin layer 61 may be disposed between the first metal layer 11 and the second metal layer 13 and may contact the top side of the insulation film 24.

The outer side of the resin layer 61 may be more internally spaced by a predetermined interval T3 than an outer part of the first metal layer 11 or the second metal layer 13. Accordingly, the outer top sides of the first metal layer 11 and the second metal layer 13 may be exposed. The interval T3 may be more than about 1 μm.

Additionally, a reflective layer may be further formed on a top portion or a side of the resin layer 61 but is not limited thereto.

Figure 16:
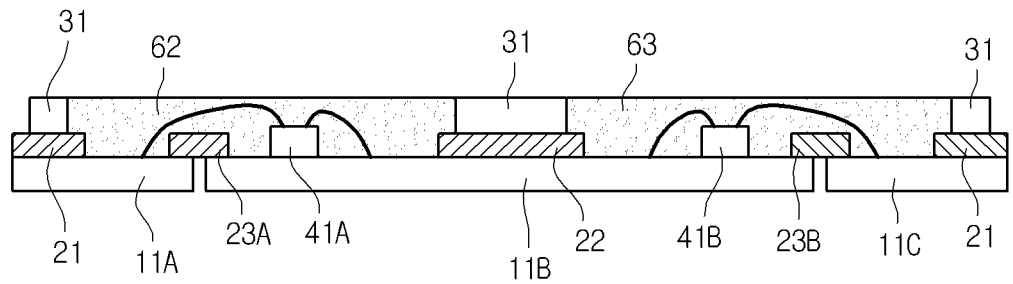
FIG. 16 is a cross-sectional view of a light emitting device according to a fourth embodiment.

FIG. 16 is a cross-sectional view illustrating a light emitting device including a plurality of light emitting chips according to a fourth embodiment.

Referring to FIG. 16, the light emitting device includes more than three metal layers 11A, 11B, and 11C and more than two light emitting chips 41A and 41B. The light emitting chips 41A and 41B may emit a light having the same or different peak wavelength.

The metal layers 11A, 11B, and 11C are arrayed on the same plane. A first insulation film 21 is formed around the metal layers 11A, 11B, and 11C. Second insulation films 23A and 23B are formed between the adjacent metal layers 11A and 11B, and 11B and 11C, respectively, to support and fix the adjacent metal layers 11A and 11B, and 11B and 11C. The third insulation layer 22 is formed at the center of the second metal layer 11B to be divided into two areas.

The first to third insulation films 21, 23A, 23B, and 22 may be formed of a single film or respectively separated films, and are not limited thereto.

A first light emitting chip 41A and a second light emitting chip 41B are spaced from each other and disposed on the second metal layer 11B and a third insulation film 22 is disposed between the first light emitting chip 41A and the second light emitting chip 41B.

A guide member 31 is formed on the first insulation film 21 and the third insulation film 22. The guide member 31 is formed higher than the top side of the light emitting chip 41 to reflect a light emitted from the light emitting chips 41A and 41B.

Resin layers 62 and 63 are formed on the first and second light emitting chips 41A and 41B, respectively, and a portion of the resin layers 62 and 63 may be formed with the same or lower height than the top side of the guide member 31, but is not limited thereto.

The second metal layer 11B may serve as a common electrode of the first light emitting chip 41A and the second light emitting chip 41B. The first metal layer 11A may serve an electrode to control the first light emitting chip 41A and the third metal layer 11C may serve as an electrode to control the second light emitting chip 41B.

According to the embodiment, it is described that the two light emitting chips 41A and 41B are disposed at the left and right. However, more than three light emitting chips may be disposed in a matrix or in a line shape crossing over the same center. The light emitting chips may be connected to each other in series or parallel and are not limited thereto.

Figure 17:
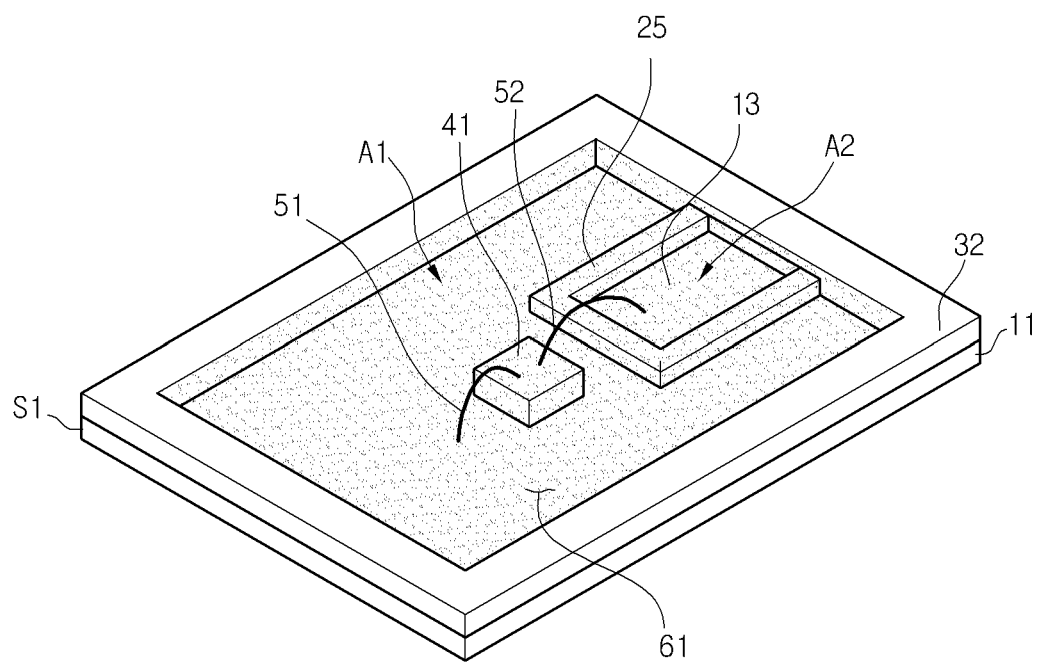
FIGS. 17 and 18 are perspective view and its cross-sectional view of a light emitting device according to a sixth embodiment.
Figure 18:
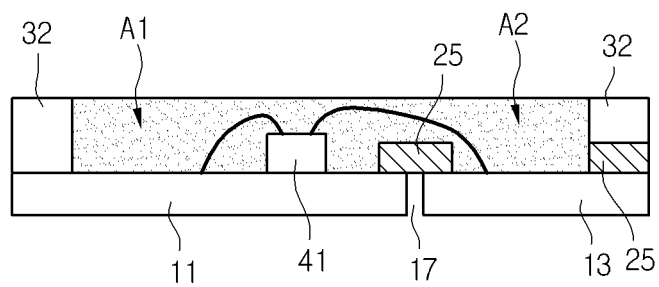

FIGS. 17 and 18 are a perspective view and its cross-sectional view illustrating a light emitting device according to a fifth embodiment.

Referring to FIGS. 17 and 18, an insulation film 25 is adhered to the circumference in the top side area of a second metal layer 13 to support the first metal layer 11 and the second metal layer 13. The insulation film 25 covers a separation part 17 between the first metal layer 11 and the second metal layer 13 to support between the first metal layer 11 and the second metal layer 13.

A guide member 32 is formed around the top side area of the first metal layer 11 and a portion of it may be disposed on the outer top side of the insulation film 25. The guide member 32 may be disposed around the top side area of the first metal layer 11 and on the outer top side of the insulation film 25. The guide member 32 may be electrically connected on the top side of the first metal layer 11 and may be electrically separated from the top side of the second metal layer 13 through the insulation film 25. The guide member 32 may be formed around the first metal layer 11 and the insulation film 25 with a loop shape, a frame shape, or a ring shape. The insulation film 25 may be formed around the top side area of the second metal layer 13 with a loop shape, a frame shape, or a ring shape.

The insulation film 25 prevents physical or electrical contacts between the guide member 32 and the second metal layer 13 and also avoids an electrical short between the first metal layer 11 and the second metal layer 13. The insulation film 25 and the guide member 32 may support and fix the adjacent two metal layers 11 and 13. A thickness of the guide member 31 may be formed identical to that of the resin layer 61.

According to this embodiment, an area of the insulation film 25 is decreased and an area of the guide member 32 is increased, so that optical reflection efficiency can be improved.

Figure 19:
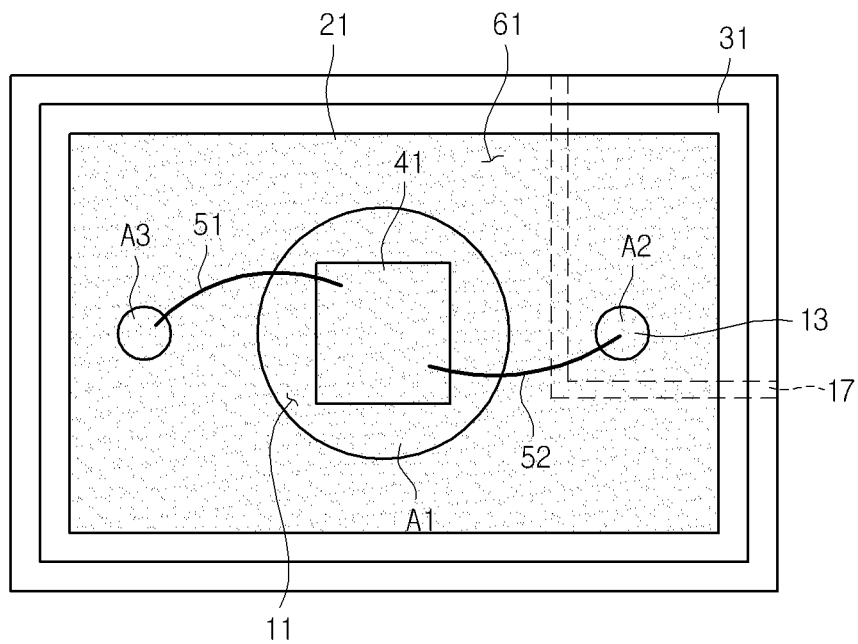
FIGS. 19 and 20 are a plan view and its cross-sectional view of a light emitting device according to a seventh embodiment.
Figure 20:
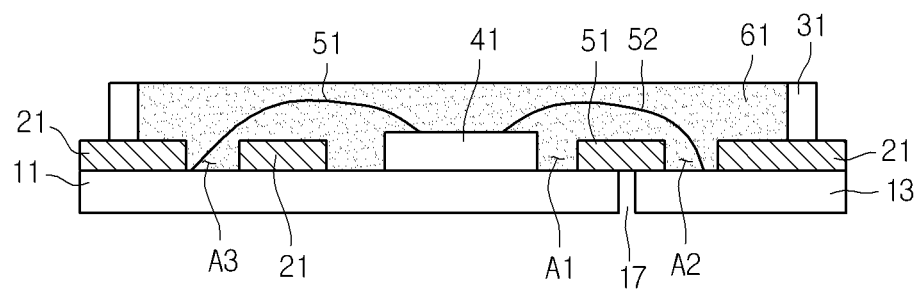

FIGS. 19 and 20 are a plan view and its cross-sectional view illustrating a light emitting device according to a sixth embodiment.

Referring to FIGS. 19 and 20, insulation films 21 and 23 are formed on an entire top side of the first and second metal layers 11 and 13 and include a plurality of open areas A1, A2, and A3. The plurality of open areas A1, A2, and A3 include a first open area A1 where a light emitting chip 41 is mounted on a first metal layer 11, a second open area A2 where a second wire 52 is bonded on a second metal layer 12, and a third open area A3 where a first wire 51 is bonded on the first metal layer 11. As another example, the third bonding area A3 may not be formed when the light emitting chip 41 has a vertical electrode structure.

The first to third open areas A1, A2, and A3 may be formed with a circular shape or a polygonal shape. Here, the second open area A2 may be formed with a size which is at least four times less than a lower area of the light emitting chip 41. The widths or diameters of the first and third open areas A1 and A3 may be formed larger than a wire diameter (for example, about 20 μm to about 50 μm), for example, about 60 μm to about 120 μm.

Since adhesive areas of the insulation films 21 and 23 are wider width than that of the structure of FIG. 1, they may support more firmly the first metal layer 11 and the second metal layer 13. A guide member 31 may be formed around the top side of the insulation films 21 and 23 and a resin layer 61 may be molded at the inner side of the guide member 31.

Figure 21:
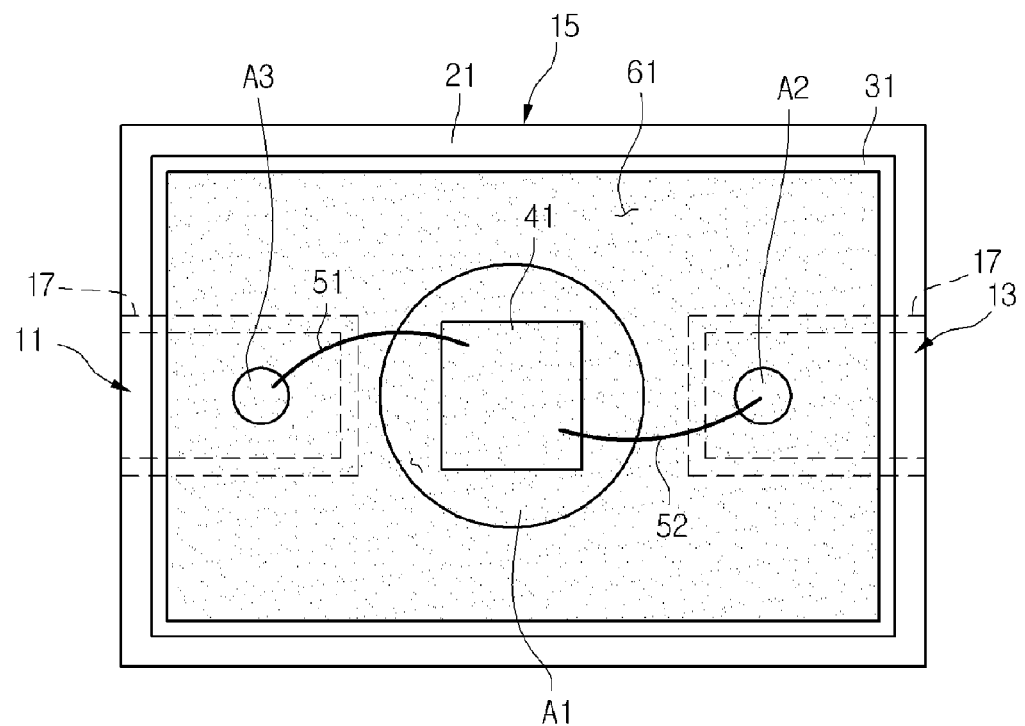
FIG. 21 is view of a modification of FIG. 19.

FIG. 21 is a plan view illustrating another example of FIG. 19.

Referring to FIG. 21, a light emitting device includes three metal layers 11, 13, and 15 and an insulation film 21 attached on the metal layers 11, 13, and 15. A plurality of open area A1, A2, and A3 are formed in the insulation film 21 and expose the top side portions of the metal layers 11, 13, and 15, respectively.

A third metal layer 15 is disposed between the first metal layer 11 and the second metal layer 13 and a light emitting chip 41 is mounted on the third metal layer 15. The light emitting chip 41 is disposed on a first open area A1 and a second open area A2 and a third open area A3 may be a wire bonding areas.

The light emitting chip 41 is connected to the first metal layer 11 in the third open area A3 through a first wire 51 and is connected to the second metal layer 13 in the second open area A2 through a second wire 52.

The open areas A1, A2, and A3 of the insulation film 21 are areas where the light emitting chip 41 and the wires 51 and 52 are disposed on the top side of the metal layers 11, 13, and 15. Also, the insulation film 21 firmly supports between the metal layers 11, 13, and 15 and prevents a step difference between the lower sides of the metal layers 11, 13, and 15 to improve electrical reliability according to solder bonding and also to improve thermal transfer efficiency.

FIGS. 22 to 31 are views illustrating modifications of a metal layer and an insulation film according to embodiments.

Figure 22:
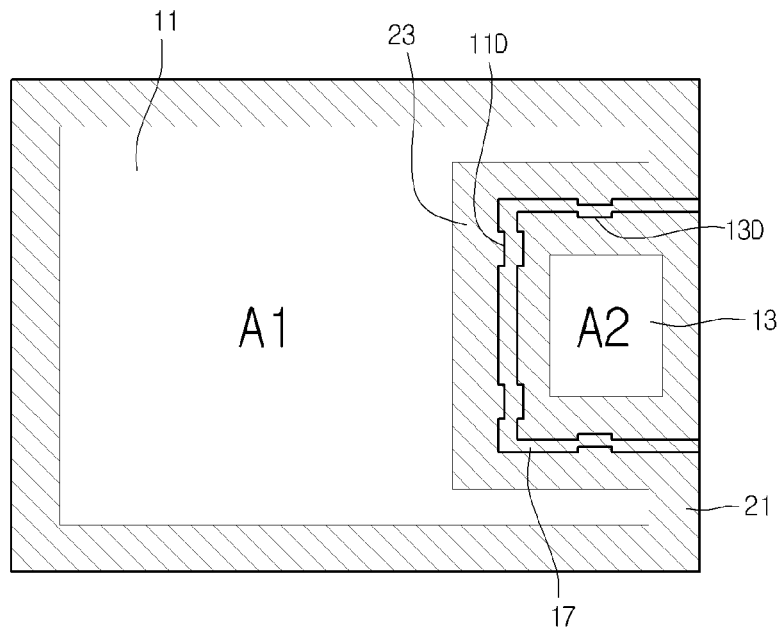
FIGS. 22 to 55 are views illustrating modifications of a light emitting device according to other embodiments.

Referring to FIG. 22, a second metal layer 13 may be disposed on at least a portion of a first metal layer 11 and may be formed with a circular shape, a polygonal shape, or a random shape at one side of the first metal layer 11. A separation part 17 between the first metal layer 11 and the second metal layer 13 may be formed with a uniform or irregular width.

The first metal layer 11 and the second metal layer 13 may have mutually corresponding sides in uneven structures 11D and 13D. The uneven structures 11D and 13D may improve the bonding efficiency of the second insulation film 23.

Figure 23:
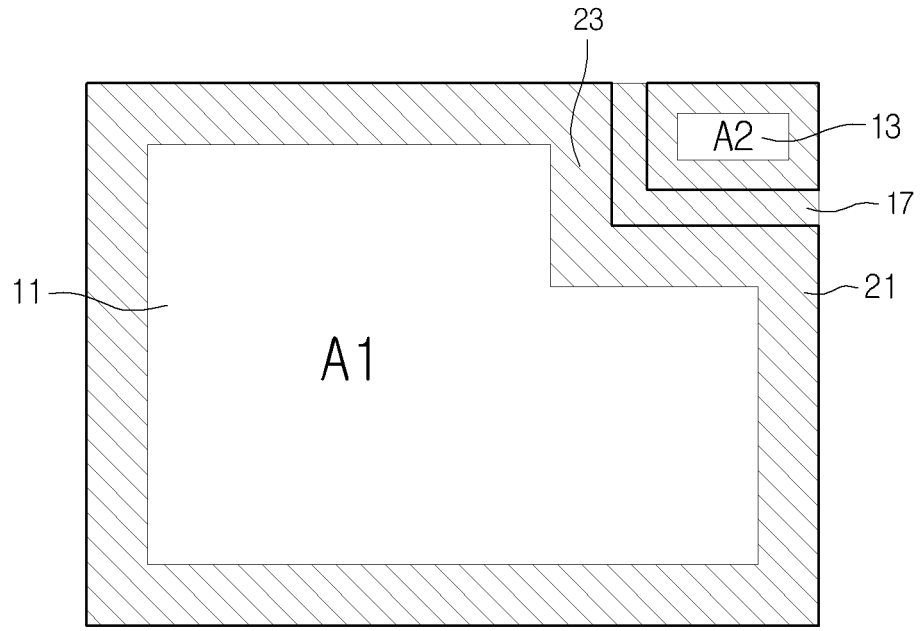

As shown in FIG. 23, the second metal layer 13 may be formed with a predetermined shape such as a circular or polygonal shape, on at least one edge area of the first metal layer 11.

Figure 24:
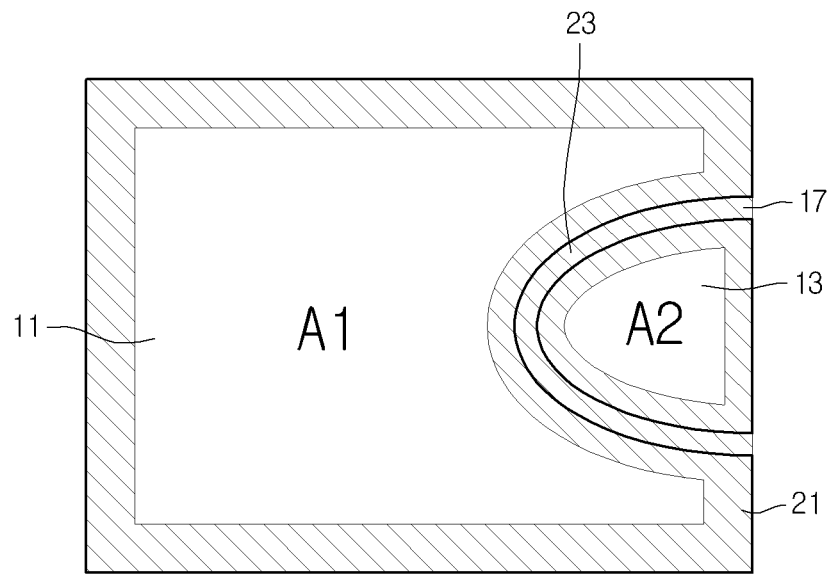
Figure 25:
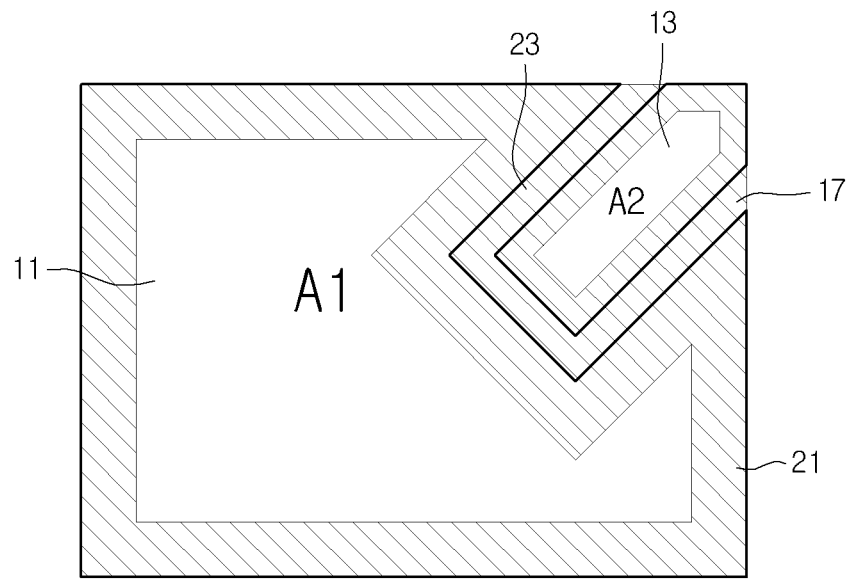

As shown in FIGS. 24 and 25, the second metal layer 13 may be formed with a hemispherical shape on at least a portion of the first metal layer 11 or may be formed with a polygonal shape on an edge area of the first metal layer 11.

Figure 26:
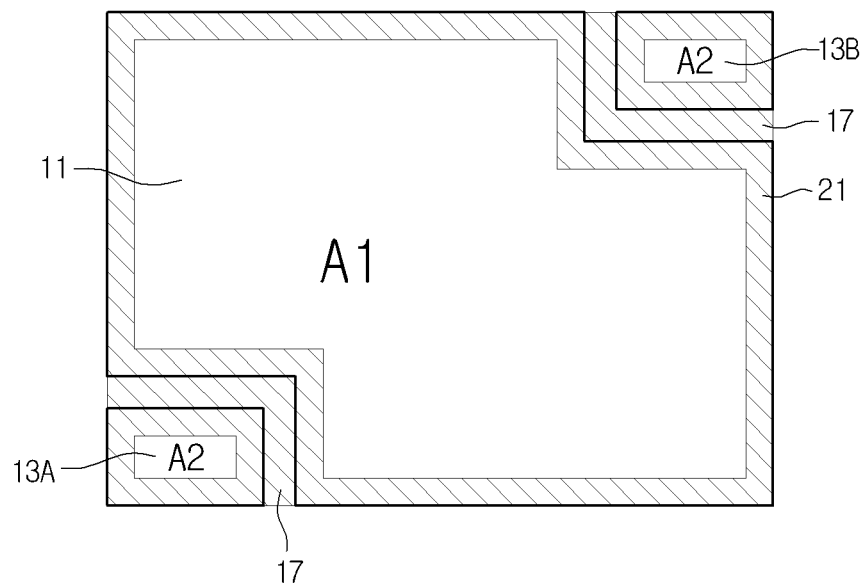

As shown in FIG. 26, the second and third metal layers 13A and 13B may be formed with a circuit or polygonal shape on at least two edge areas of the first metal layer 11. The second and third metal layers 13A and 13B may be formed at the edge areas facing each other of the first metal layer 11 or may serve as electrode. One of the second and third metal layers 13A and 13B may serve a dummy pattern. The insulation films 21 and 23 may be formed around the three metal layers 11, 13A, and 13B and may expose the top sides of the three metal layers 11, 13A, and 13B through the open areas A1 and A2.

Figure 27:
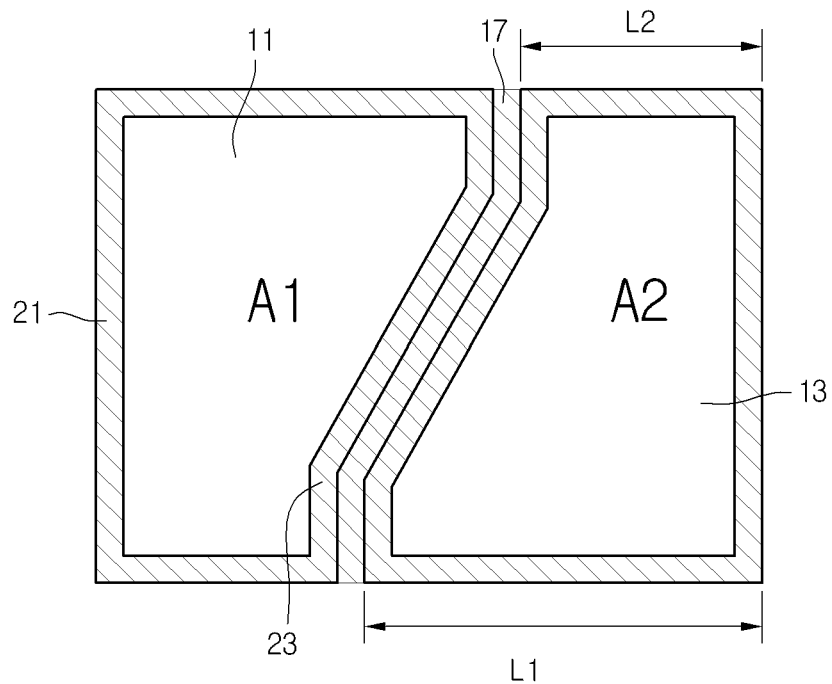

As shown in FIG. 27, the first metal layer 11 and the second metal layer 13 are divided by a separation part 17 at the center and may be formed with the same or symmetrical area. The length L1 of a first side of the second metal layer 13 may be less than that of an opposite second side L2, but is not limited thereto.

Figure 28:
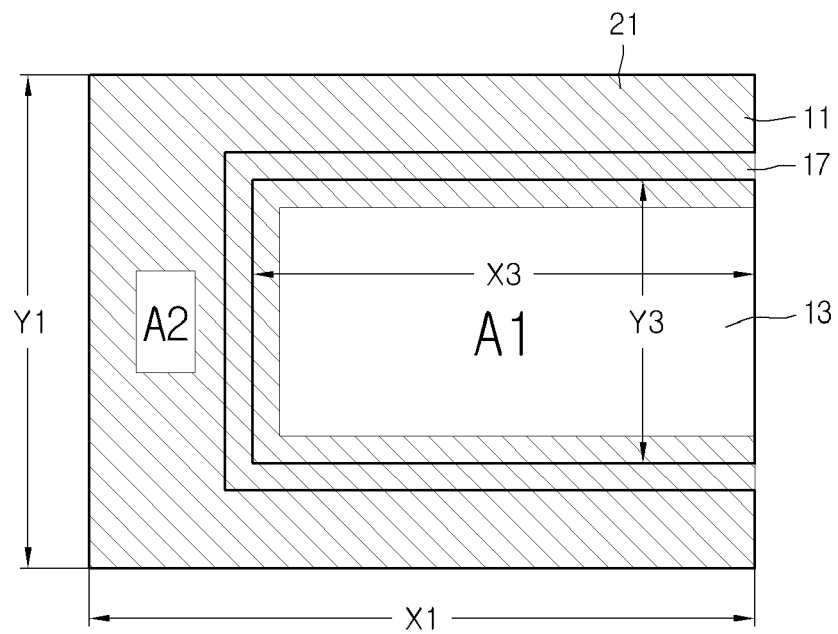

Referring to FIG. 28, the second metal layer 13 may be formed at a portion of the first metal layer 11. The first direction width X3 may be formed to be more than ½ times than the first direction width X2 of the second metal layer 11.

The first direction width Y3 of the second metal layer 13 may be formed to be more than ½ times than the second direction width Y1 of the first metal layer 11.

An insulation film 21 is formed on an interface part of the first and second metal layers 11 and 13. The insulation film 21 covers an area except the second open area A2 and an outer top side of the second metal layer 13 may be exposed without forming the insulation film 21.

A light emitting chip is mounted on the open area A1 of the second metal layer 13 and may be electrically connected to the two metal layers 11 and 13.

Figure 29:
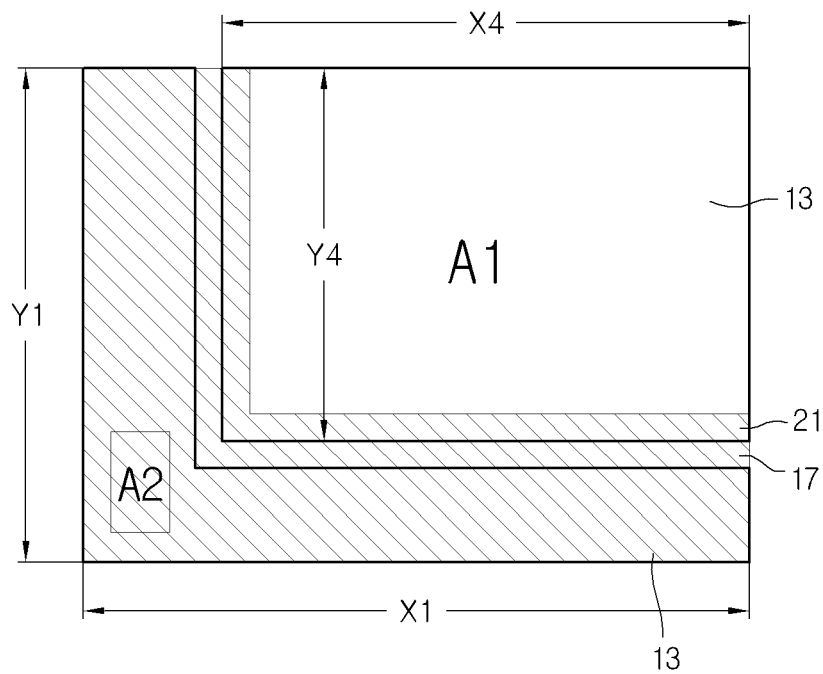

Referring to FIG. 29, the second metal layer 13 may be formed at the edge portion of the first metal layer 11 and the first direction width X4 and the second direction width Y4 of the second metal layer 13 may be formed to be more than ½ times than the first direction width X1 and the second direction widths X1 and Y1 of the first metal layer 11.

Since a guide member is formed without forming an insulation film on the outer top side of the second metal layer 13, an area covered by the guide member can be improved.

Figure 30:
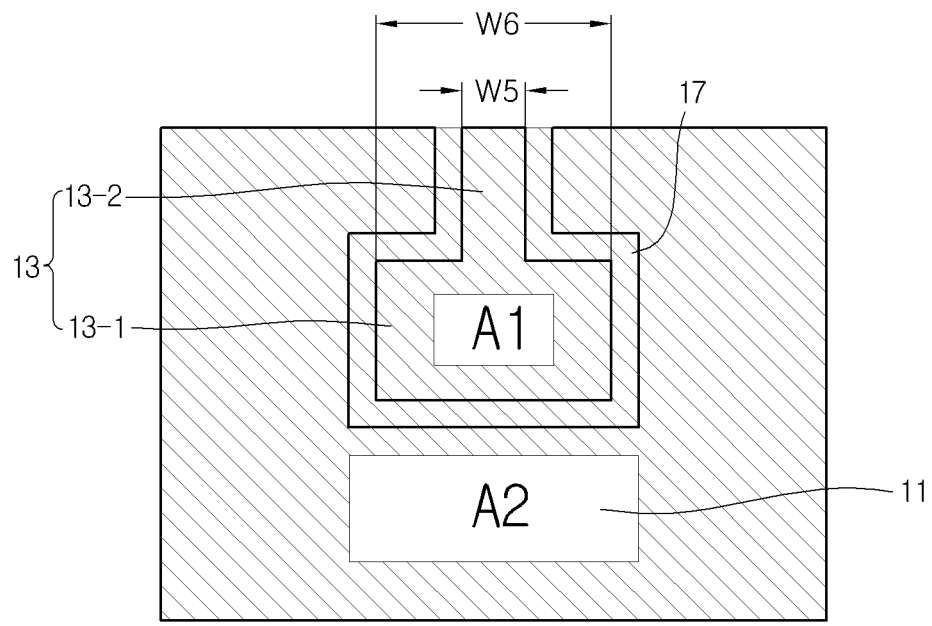

Referring to FIG. 30, the second metal layer 13 extends into the inside through one side part of the first metal layer 11 but may be formed in the first metal layer 11.

The width W5 of the outer part 13-1 of the second metal layer 13 may be formed to be narrower than the width W6 of the inner part 13-2. A light emitting chip may be disposed in the first open area A1 of the second metal layer 13 and is not limited thereto.

Figure 31:
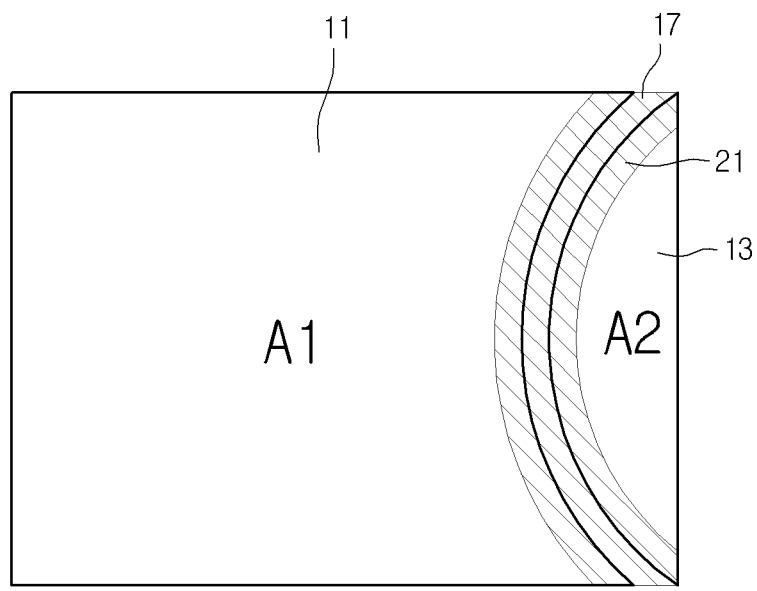

Referring to FIG. 31, the second metal layer 13 may have a diameter as long as the width of the first metal layer 11 and have a hemispheric shape. An insulation film 21 may be formed on the top side of an interface part of the first metal layer 11 and the second metal layer 13 and a guide member may be formed around the top side of the metal layer 11 and 13.

Seventh Embodiment

Figure 32:
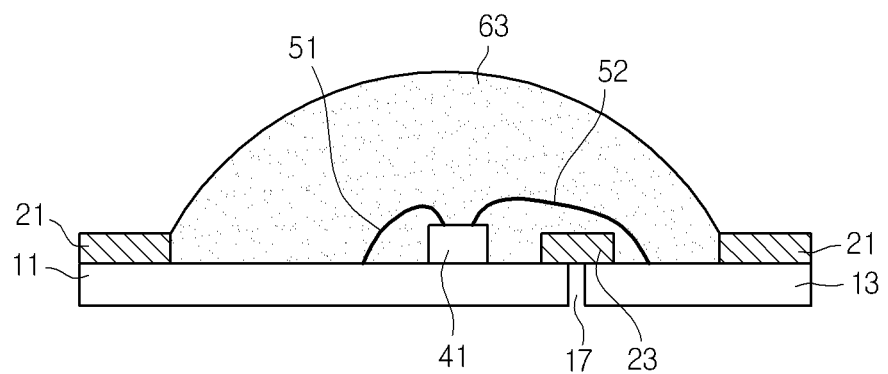

Referring to FIG. 32, a first insulation film 21 is formed around a top side area of a first metal layer 11 and a second metal layer 13 and a second insulation film 23 covering between the first metal layer 11 and the second metal layer 13 is formed. The first insulation film 21 and the second insulation film 23 are connected to each other and there is an open area between the first insulation film 21 and the second insulation film 23.

A resin layer 63 is formed in an open area of the first insulation film 21 to cover a light emitting chip 41. The resin layer 63 is hardened by dispensing an insulation material of a liquid resin series. At this point, the first insulation film 21 serves as a dam around the resin layer 63. The resin layer 63 may be formed with a surface of a convex lens shape. The center part of the resin layer 63 may be formed with a thicker thickness than the first insulation film 21 and the second insulation film 23.

A guide member 31 or a reflective material may be further formed around the resin layer 63 and is not limited thereto.

Eighth Embodiment

Figure 33:
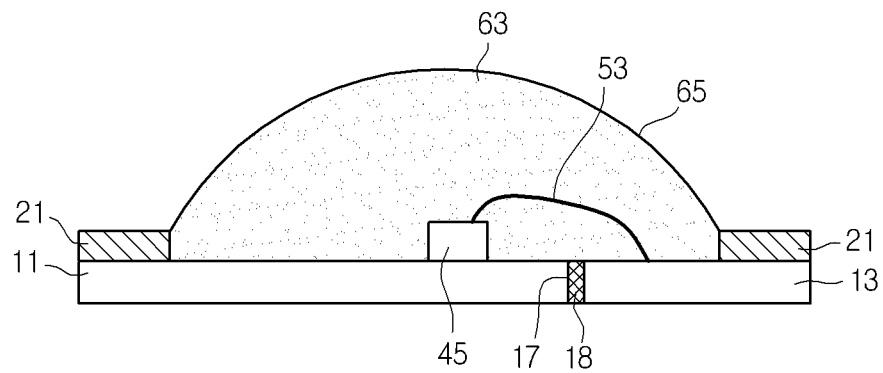

Referring to FIG. 33, a light emitting chip 45 is die-bonded on a first metal layer 11 and is connected to a second metal layer 13 through a wire. The resin layer 63 is formed on the first metal layer 11 and the second metal layer 13.

The resin layer 63 is disposed on the top side of the metal layers 11 and 13 and an insulation film 21 is disposed around the resin layer 63. The resin layer 63 may be formed with a convex lens shape. A guide member 31 or a reflective material may be further formed around the resin layer 63, and is not limited thereto.

A spacer 18 is disposed on a separation part 17 between the first metal layer 11 and the second metal layer 13. The spacer 18 is disposed between the first metal layer 11 and the second metal layer 13 and includes insulation material. The spacer 18 is adhered between the first metal layer 11 and the second metal layer 13 and provides an interval between the first metal layer 11 and the second metal layer 13 to prevent electrical short. The spacer 18 may include at least one of $SiO_2$, $SiO_x$, $SiO_xN_y$, $Si_3N_4$, and $Al_2O_3$.

The lower side of the resin layer 63 may contact the top sides of the first metal layer 11 and the second metal layer 13 and the top side of the spacer 18.

Ninth Embodiment

Figure 34:
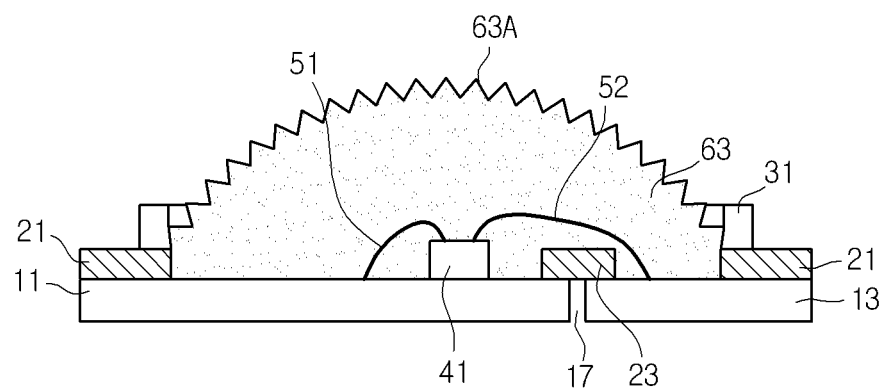

Referring to FIG. 34, roughness 63A is formed on the surface of a resin layer 63. The roughness 63A may be formed with a rough surface by performing an etching or injecting process on the surface of the resin layer 61. The roughness 63A changes a critical angle of light progressing into the external of the resin layer 63, thereby improving light extraction efficiency.

Tenth Embodiment

Figure 35:
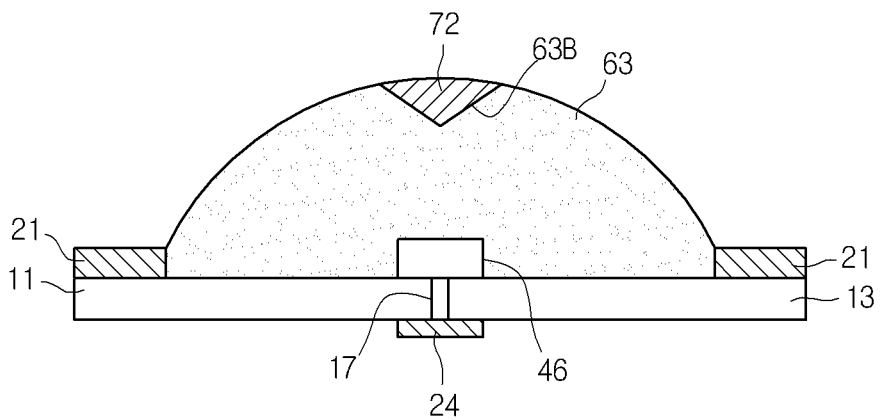

Referring to FIG. 35, a light emitting chip 41 may be mounted on a first metal layer 11 and a second metal layer 13 thorough a flip method. The light emitting chip 41 is mounted on the first metal layer 11 and the second metal layer 13. The widths of the first metal layer 11 and the second metal layer 13 may be formed identical to each other.

A second insulation film 24 is attached to the lower sides of the first metal layer 11 and the second metal layer 13 to insulate between and support the metal layers 11 and 13.

A first insulation film 21 is attached to around the top side area of the first metal layer 11 and the second metal layer 13 to fix them 11 and 13.

The second insulation film 21 serves as a dam to prevent an overflow of the resin layer 63. A portion of the resin layer 63 may be filled between the first and second metal layers 11 and 13 and maintains an interval between the second insulation film 21 and the metal layers 11 and 13.

The resin layer 63 may be formed with a convex hemispherical shape and a concave part 63B having a predetermined depth is formed in the center of the resin layer 63. The concave part 63B may be formed with a horn shape or a hemispherical shape and a reflective material 72 may be formed in the concave part 63B. The reflective material 72 may include a metal oxide and may be formed of at least one layer including a material such as $TiO_2$, or/and $SiO_2$, so thereby reflecting an incident light into a side direction. The resin layer 63 and the reflective material 72 may have respectively different refractive indices. For example, the reflective material 72 may be formed with a higher refractive index. The resin layer 63 reflects light in a center direction toward a side direction so uniformly form optical orientation angle distribution.

Moreover, the concave part 63B may be formed of a scattering substance instead of a reflective material but is not limited thereto.

Eleventh Embodiment

Figure 36:
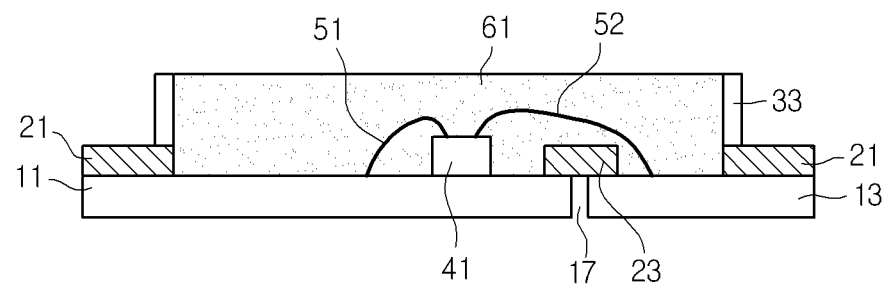

Referring to FIG. 36, a guide member 33 is formed on a side of the resin layer 61. After the forming of the resin layer 61, the guide member 33 may be deposited by performing a sputtering or deposition method on at least two sides of the resin layer 61. Due to the guide member 33, manufacturing process may be changed and the width and thickness of the guide member 33 may be adjusted according to a deposition time. The guide member 33 may be formed of a reflective material containing a metal such as Al or Ag or a light-transmitting material having a high refractive index.

Twelfth Embodiment

Figure 37:
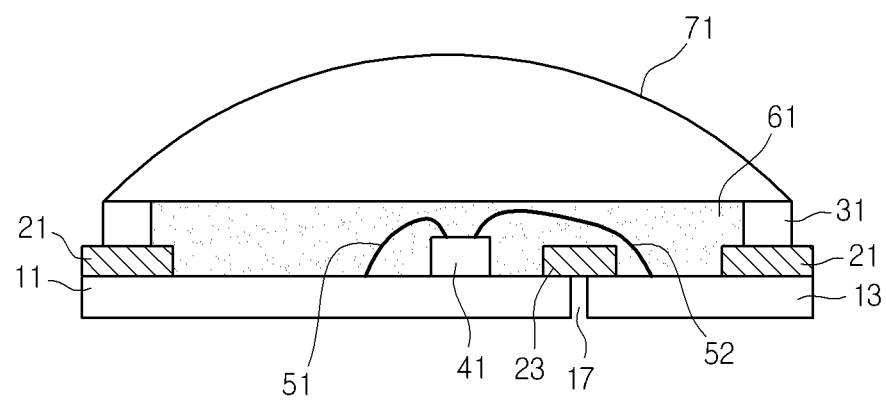

Referring to FIG. 37, in relation to a light emitting device, a lens 71 is disposed on a resin layer 61. A lens 71 on the resin layer 61 may have a convex hemispherical shape and may be adhered to the top side of the resin layer 61 and the guide member 31. The guide member 31 and the lens 71 may have an uneven surface and are not limited thereto.

Thirteenth Embodiment

Figure 38:
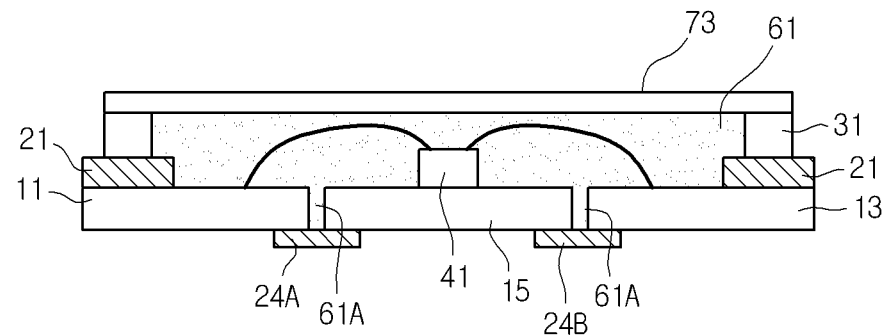
Figure 39:
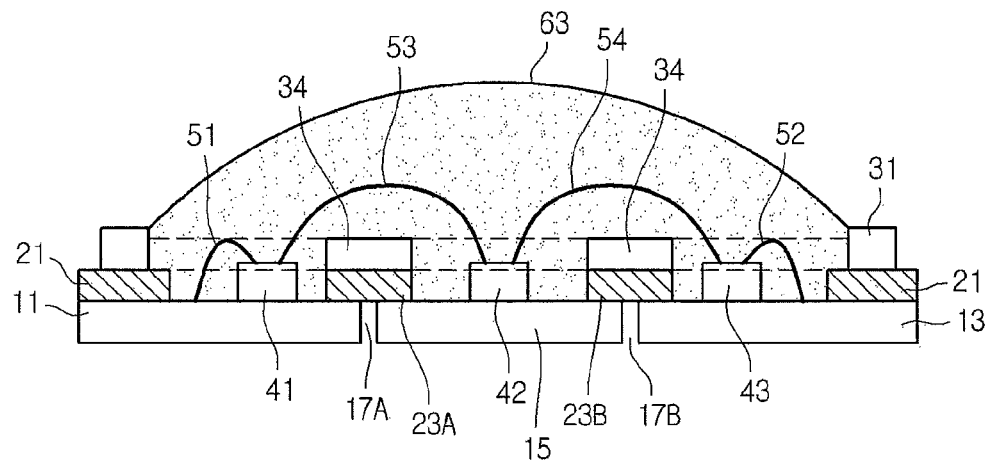

Referring to FIG. 38, in relation to a light emitting device, three metal layers 11, 13, and 15 are arranged. The first and second metal layers 11 and 13 among the three metal layers 11, 13, and 15 may be used as an electrode and the third metal layer 15 may be disposed between the first and second metal layers 11 and 13 to be used as a heat radiation plate.

A first insulation film 21 is formed around the top areas of the first to third metal layers 11, 13, and 15 to serve as a barrier of the resin layer 61 and support the metal layers 11, 13, and 15. Second and third insulation films 24A and 24B are adhered to below an area between the first and third metal layers 11 and 15 and an area between the second and third metal layers 13 and 15 to support the area between them 11 and 15 and the area between them 13 and 15. The second and third insulation films 24A and 24B may prevent an electrical short between adjacent metal layers. The second and third insulation films 24A and 24B may be disposed as a single film or a separated film on respectively different areas.

Moreover, a portion 61A of the resin layer 61 is filled between the first and third metal layers 11 and 15 and between the second and third metal layers 13 and 15 to be adhered to the sides of adjacent metal layers. Here, the second and third insulation films 24A and 24B may be removed after the resin layer 61 is hardened. The metal layers 11, 13, and 15 are supported by the resin layer 61 and the first insulation film 21 and their lower sides may be formed flat.

A phosphor layer 73 is formed on the top side of the resin layer 61 and may be a film type including phosphor or a resin layer including a phosphor added. The phosphor layer 73 may be formed extending from the top side of the resin layer 61 to the top side of the guide member 31. The phosphor layer 73 absorbs a part of a light emitted from the light emitting chip and then emits a light having a longer wavelength than the absorbed light, thereby moving color coordinate distribution to desired distribution.

Fourteenth Embodiment

Referring to FIG. 38, in relation to a light emitting structure, a second guide member 35 is further disposed on second and third insulation films 23A and 23B.

The second and third insulation films 23A and 23B cover separation parts 17A and 17B between adjacent metal layers 11, 13, and 15 to be adhered to the interface top sides of the metal layers 11, 13, and 15. Then, a second guide member 34 is formed on the second insulation films 23A and 23B. A first guide member 31 is formed on the first insulation film 21. The light emitting chips 41, 42, and 43 are disposed in open areas of the first guide member 31 and the second guide member 34. The first guide member 31 and the second guide member 34 are disposed around the light emitting chips 41, 42, and 43, thereby effectively reflecting an incident light.

The first light emitting chip 41 is disposed on the first metal layer 11, the second light emitting chip 42 is disposed on the third metal layer 15, and the third light emitting chip 43 is disposed on the second metal layer 13. The first light emitting chip 41 is connected to the first metal layer 11 and a first electrode of the second light emitting chip 42 through wires 51 and 53. The second electrode of the second light emitting chip 42 is connected to the first electrode of the third light emitting chip 43 through a wire 54. The second electrode of the third light emitting chip 43 is connected to the second metal layer 13 through the wire 52. The second light emitting chip 42 is directly connected to other light emitting chips and is not limited thereto.

The first light emitting chip 41 is connected to the first metal layer 11 through the wire 51. The first light emitting chip 41 and the second light emitting chip 42 are connected to each other through the wire 53. The third light emitting chip 43 may be connected to the second metal layer 13 through the wire 52.

Fifteenth Embodiment

Figure 40:
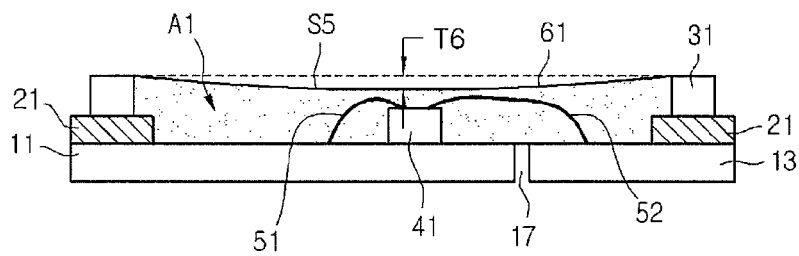

Referring to FIG. 40, in relation to a light emitting device, a resin layer 61 may be formed with a concave surface. For example, the resin layer 61 may have a lens shape with a high side part and a low center part. The gap T6 between the side part and the center part of the resin layer 61 may be about 0.001 mm to about 1 mm. This gap T6 may prevent the contact of the optical guide plate so that abnormal color distribution such as chromatic blur due to the contact with the optical guide plate can be prevented.

Sixteenth Embodiment

Figure 41:
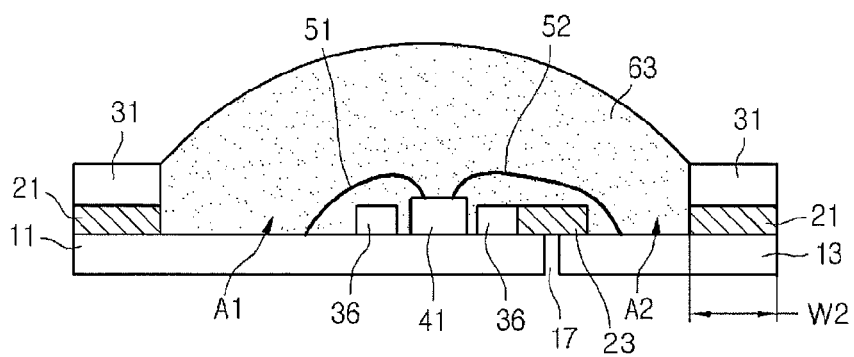

Referring to FIG. 41, a first guide member 31 is formed on a first insulation film 21 and a second guide member 36 is formed around a light emitting chip 41. The second guide member 36 may be formed around the light emitting chip 41, with a thicker or thinner thickness than the light emitting chip 41. A portion of the second guide member 36 is disposed between the light emitting chip 41 and the second insulation film 23. Another portion of the second guide member 36 may be disposed between the light emitting chip 41 and a first wire 51.

The second guide member 36 may be formed with a frame shape, a loop shape, or a ring shape. The second guide member 36 may be formed in the first open area A1 of the first metal layer 11, so thereby effectively reflecting a light emitted from the light emitting chip 41.

The first guide member 31 may be formed with the same width as the first insulation film 21. The first guide member 31 is formed by performing a process such as punching after the first guide member 31 is adhered on the first insulation film 21

According to the embodiment, the guide members 31 and 36 are doubly disposed around the light emitting chip 41, thereby improving light reflection efficiency and orientation angle distribution.

Seventeenth Embodiment

Figure 42:
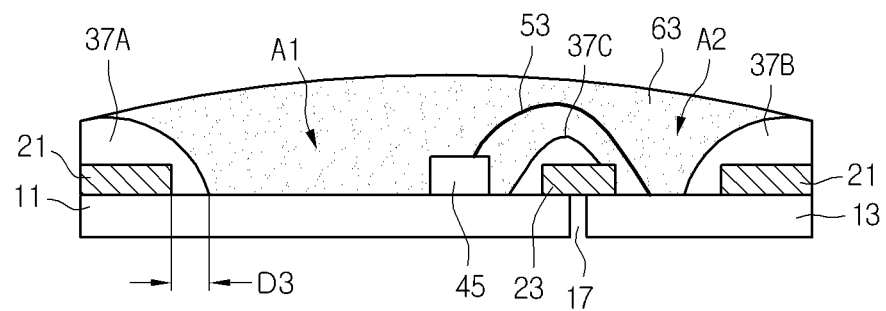

Referring to FIG. 42, in relation to a light emitting device, first and third guide member 37A and 37B are formed on a first insulation film 21. The first guide member 37A is disposed on the top side and inner side of the first insulation film 21 and its lower sides may contact the top side of the first metal layer 11. The third guide member 37B is disposed on the top side and inner side of the first insulation film 21 and its lower sides may contact the top side of the second metal layer 13. The first guide member 37A extends to the top sides of the metal layers 11 and 13 by a predetermined distance D3. The distance D3 may be more than about 0.1 mm.

If the first and third guide members 37A and 37B are formed of a non-metallic material or an insulation resin material, they may be connected to each other.

If the first and third guide members 37A and 37B are formed of a conductive material, they may be physically separated from each other and their separated area is a gap between the first metal layer 11 and the second metal layer 13. Accordingly, the guide member 37A on the first metal layer 11 and the third guide member 37B on the second metal layer 13 are separated from each other, thereby preventing electrical short.

Additionally, the second guide member 37C is formed on the top side and the inner side of the second insulation film 23, so that it may contact the top side of the first metal layer 11. The second guide member 37B may be connected to the first guide member 37A and may be separated from the third guide member 37C. The second guide member 37C may be physically spaced from the second metal layer 13.

The first guide member 37A and the second guide member 37C are disposed in correspondence to around the light emitting chip 45, so thereby effectively reflecting a light emitted from the light emitting chip 34. The first guide member 37A and the second guide member 37C may be formed of a resin material, a non-metallic material, or a reflective metal.

Moreover, the inner sides of the first guide member 37A and the second guide member 37C correspond to the light emitting chip 45 and may be formed with a curved or inclined shape with respect to the top side of the first metal layer 11.

The first to third guide members 37A, 37C, and 37B may be formed of the same or different material and is not limited thereto. The first to third guide members 37A, 37C, and 37B may be formed of a metal material or an insulation material as another example.

Eighteenth Embodiment

Figure 43:
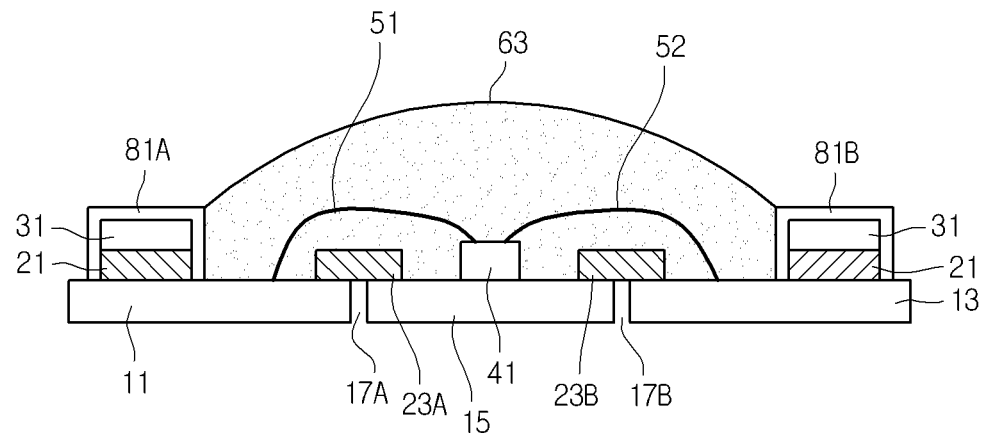

Referring to FIG. 43, in relation to a light emitting device, reflective layers 81A and 81B are further provided on a guide member 31.

The reflective layers 81A and 81B may be formed of a high reflective metal such as Ag and Al having a reflectance of more than about 70%. The high reflective metal may be formed through a plating or coating process. The reflective layers 81A and 81B may be formed on the top sides and the sides of the guide member 31 and the first insulation film 21. The reflective layers 81A and 81B may be discontinuously formed to be spaced from each other, thereby preventing an electrical short between the first metal layer 11 and the second metal layer 13.

According to the above-mentioned embodiments, the sides of the metal layers 11 and 13 may be spaced by more than about 1 μm apart from the insulation film 21 by attaching the insulation films 21, 23A and 23B around the top side areas of the metal layers 11 and 13, and are not limited thereto.

Nineteenth Embodiment

Figure 44:
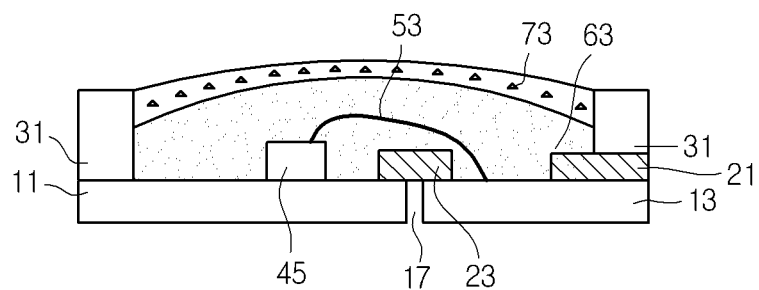

Referring to FIG. 44, in relation to a light emitting device, a light emitting chip 45 is bonded on a first metal layer 11 and a second metal layer 13 is connected to the light emitting chip 45 through a wire 53. A second insulation film 23 is attached on the top side between the first metal layer 11 and the second metal layer 13.

A guide member 31 is formed on the first metal layer 11 and the first insulation film 21 with a continuous or discontinuous shape which may be a frame shape, a loop shape, or a ring shape.

A resin layer 63 may be formed in the guide member 31 and a phosphor layer 73 may be formed on the resin layer 63. The phosphor of the phosphor layer 73 may be dispersed in an entire area and is spaced from the light emitting chip 45, thereby preventing discoloration.

Twentieth Embodiment

Figure 45:
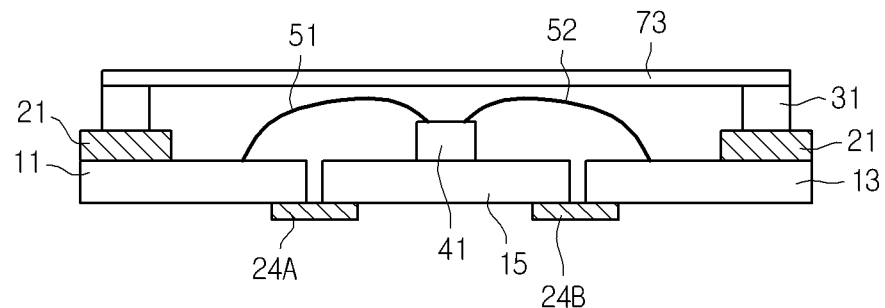

Referring to FIG. 45, in relation to a light emitting device, a resin layer is removed and a photo luminescent film 74 is disposed on a light emitting chip 41. The photo luminescent film 74 is disposed being spaced from the metal layers 11, 13, and 15 and is supported by the guide member 31.

Second insulation films 24A and 24B may be disposed on the top side or lower side between the metal layers 11, 13, and 15 and are not limited thereto.

Twenty First Embodiment

Figure 46:
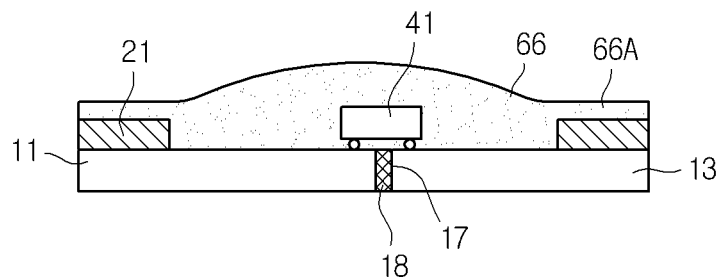
Figure 47:
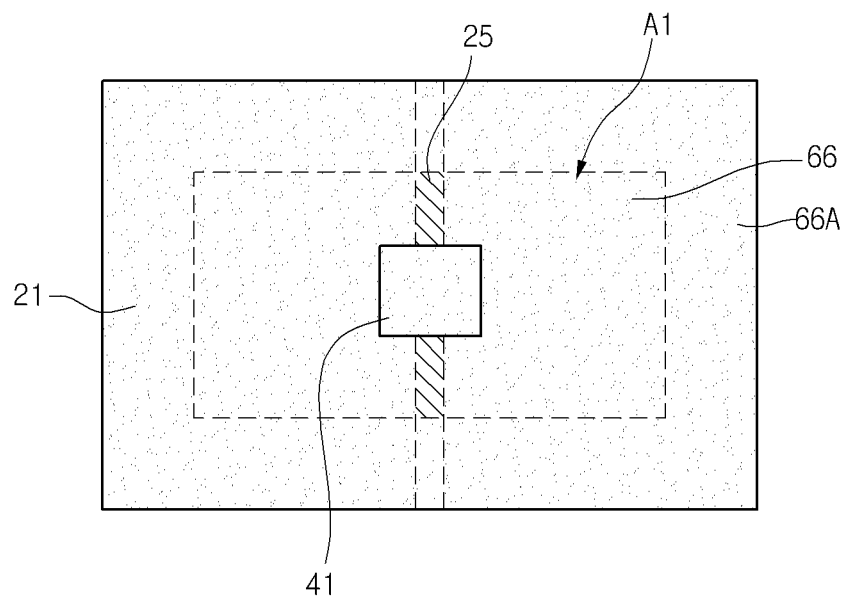

FIG. 46 is a cross-sectional view of a light emitting device and FIG. 47 is a plane view of FIG. 46.

Referring to FIGS. 46 and 47, a light emitting chip 41 is mounted on a first metal layer 11 and a second metal layer 13 through a flip method. An insulation film 21 is formed around the first metal layer 11 and the second metal layer 13. A spacer 18 formed of an insulation material may be formed between the first metal layer 11 and the second metal layer 13.

The spacer 18 prevents an overflow of the resin layer 66.

The resin layer 66 is formed around the light emitting chip 41 and its portion may extend to the top side of the insulation film 21.

Twenty Second Embodiment

Figure 48:
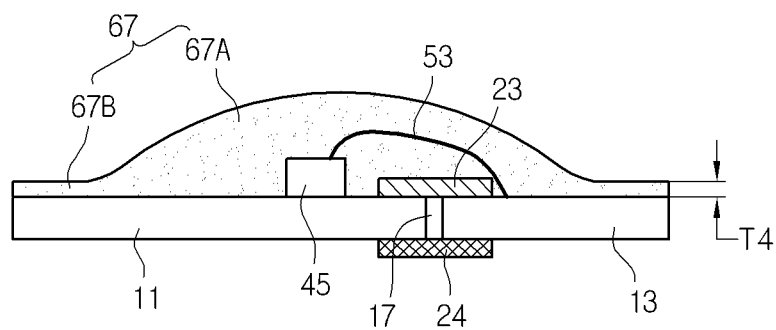

Referring to FIG. 48, in relation to a light emitting device, insulation films 23 and 24 are attached on the top side and lower side between a first metal layer 11 and a second metal layer 13. A light emitting chip 45 is disposed on the first metal layer 11 and a resin layer 67 is molded on the light emitting chip 45.

The side of the resin layer 67 may be formed collinear to the sides of the first metal layer 11 and the second metal layer 13. The width of the resin layer 67 may be formed with an interval between the both sides of the first metal layer 11 and the second metal layer 13.

Here, the resin layer 67 may be formed with a thickness T4 which is the thickest in the center part 67A and becomes progressively thinner toward the outer part 67B. The center part 67A has a convex lens shape. The thickness T4 may be formed higher or lower than the light emitting chip 45. This resin layer 67 may be manufactured using an injection molding frame. Additionally, a plurality of light emitting devices are cut and separated by a size unit of each light emitting device after the resin layer 67 is hardened. Therefore, the light emitting chip 45 is mounted on the metal layer 11 and 13 or the resin layer 67 is formed on the metal layers 11 and 13 during manufacturing processes. A separation part 17 between the metal layers 11 and 13 may be formed through a laser or cutting process after the final resin layer is formed and is not limited thereto.

Twenty Third Embodiment

Figure 49:
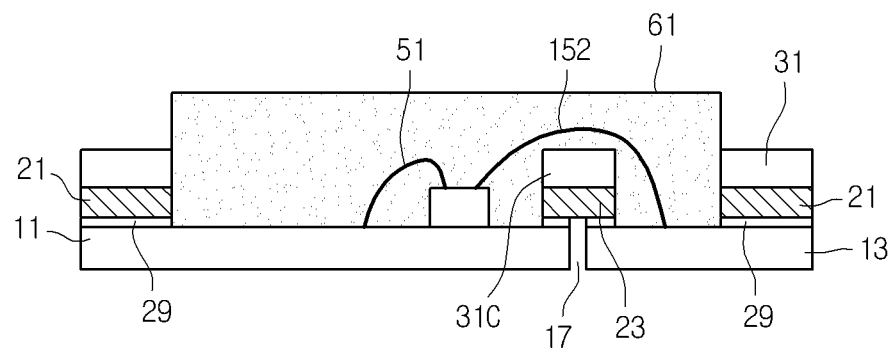

Referring to FIG. 49, in relation to a light emitting device, an adhesive layer 29 is formed between insulation films 21 and 23 and metal layers 11 and 13. The adhesive layer 29 may use an insulation adhesive such as silicon or epoxy. The thickness of the adhesive layer 29 may be formed more than about 12 μm.

Additionally, the top side of the resin layer 61 may be higher than that of a first guide member 31 or a second guide member 31C.

The second guide member 31C is disposed on the insulation film 21, thereby efficiently reflecting a light emitted from the light emitting chip 41.

Twenty Fourth Embodiment

Figure 50:
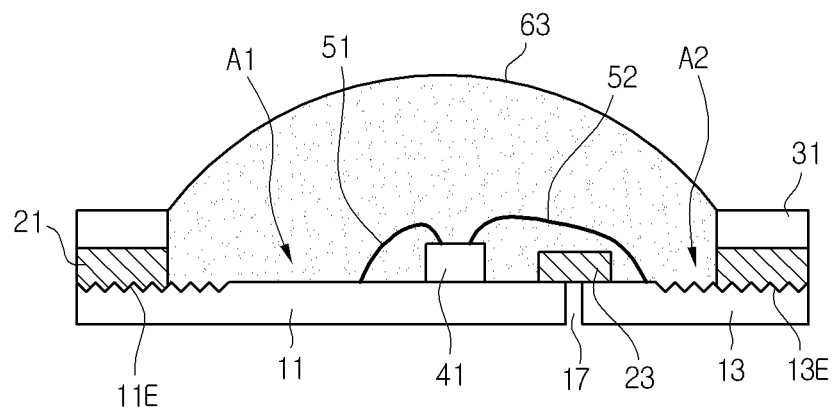

Referring to FIG. 50, the top sides of the metal layers 11 and 13 include uneven structures 11E and 13E. The uneven structures 11E and 13E may be disposed below a first insulation film 21 and may extend to open areas A1 and A2 of the metal layers The uneven structures 11E and 13E may improve a contact area of the insulation films 21 and 23 on the metal layers 11 and 13 or heat radiation efficiency.

Twenty Fifth Embodiment

Figure 51:
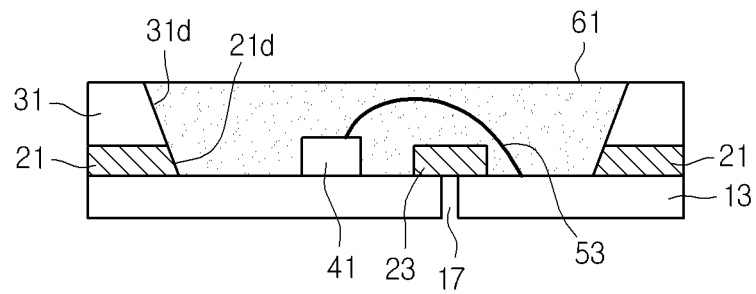
Figure 52:
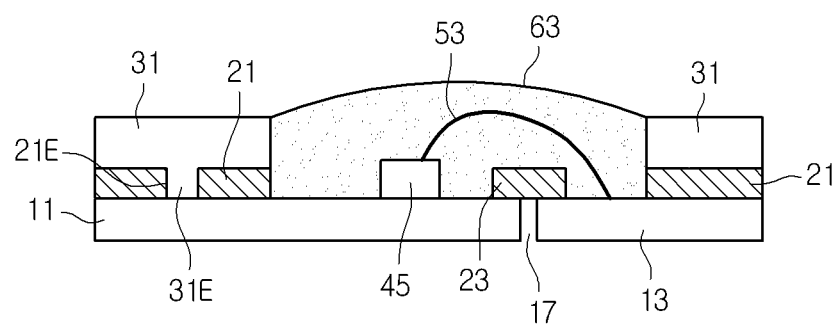
Figure 52:
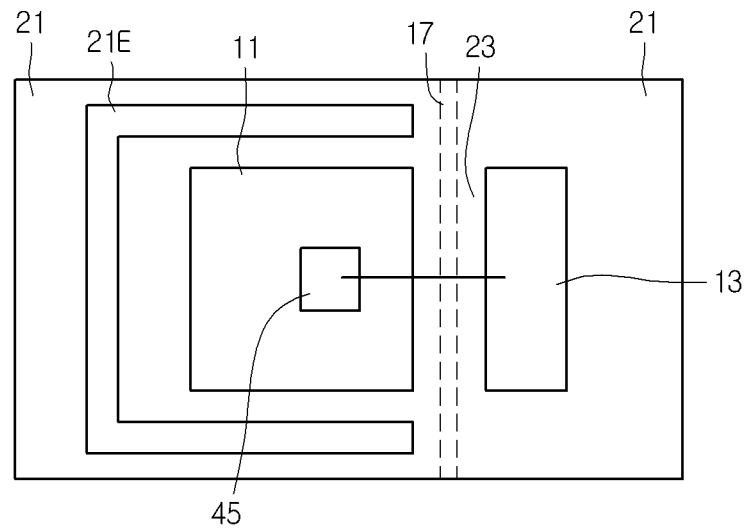

Referring to FIG. 51, at least one of inner sides of an insulation film and a guide member 31 may be formed with inclined sides 21d and 31d. The inclined sides 21d and 31d may be formed from the inner side of the first insulation film 21 to the inner side of the guide member 31. The inclined sides 21d and 31d may be formed on one or both of the sides of the first insulation film 21 and the guide member 31.

A tilting angle of the inclined sides 21d and 31d may be about 15° to about 89° with respect to the top sides of the metal layers 11 and 13. These inclined sides 21d and 31d may efficiently reflect light in an outgoing direction. Additionally, a reflective material may be coated on the inclined sides 21d and 31d. The reflective material may be formed on a non-conductive material or an insulation material such as the adhesive layer to prevent an electrical short between metal layers.

The resin layer 61 may have a flat top side and its top width may be wider than its lower side width due to the inclined sides 21d and 31d.

Additionally, the inner side of the second insulation film 23, i.e., the side corresponding to the light emitting chip 45, may be formed being inclined and is not limited thereto. Moreover, a second guide member is disposed on the second insulation film 23 and its inner side may include an inclined side.

Twenty Sixth Embodiment

FIG. 49 (a) is a cross-sectional view of a light emitting device and FIG. 49(b) is a plan view when an insulation film is disposed on a metal layer of FIG. 49(a).

Referring to FIG. 49, a hole 21E is formed in a first insulation film 21 on a first metal layer 11. The hole 21E exposes the top side of the first metal layer 11. A guide member 31 is formed on the first and second insulation films 21 and 23. A portion 31E of the guide member 31 may contact on the first metal layer 11 through the hole 21E. A portion of the guide member 31 has a protrusion shape and its width may be narrower than that of the first insulation film 21.

A portion 31E of the guide member 31 may reflect an incident light if the first insulation film 21 is formed of a light-transmitting material. Additionally, if the guide member 31 and the first metal layer are formed of a metal, they may be attached to each other to fix the first insulation film 21.

Here, if the guide member 31 is formed of a non-metallic material or a resin series having no electrical conductivity, a through hole 21E of the first insulation film 21 may be formed on each of the first metal layer 11 and the second metal layer 13, except the top side of the interface part between two metal layers 11 and 13. A portion of the guide member 31 may be formed in the hole 21E. The hole 21E may be formed in plurality on the first insulation film 21.

Twenty Seventh Embodiment

Figure 53:
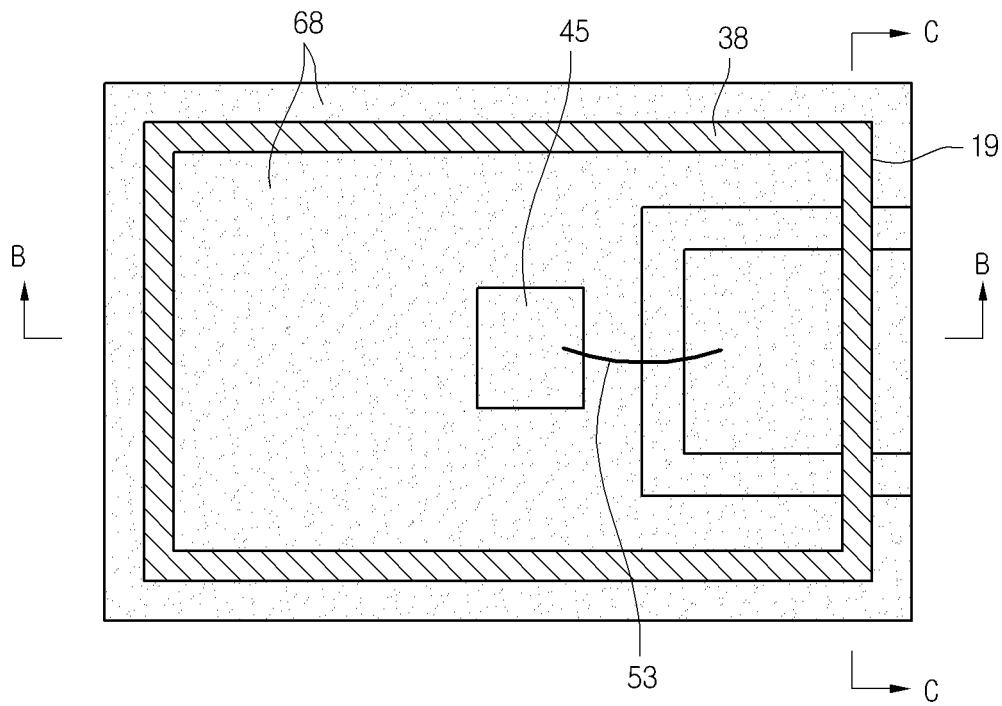
Figure 54:
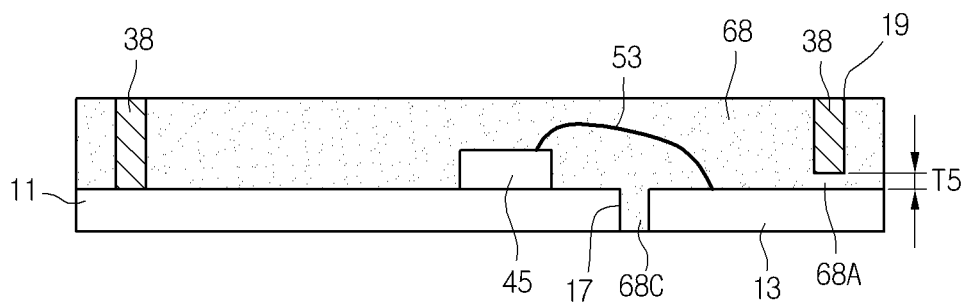
Figure 55:
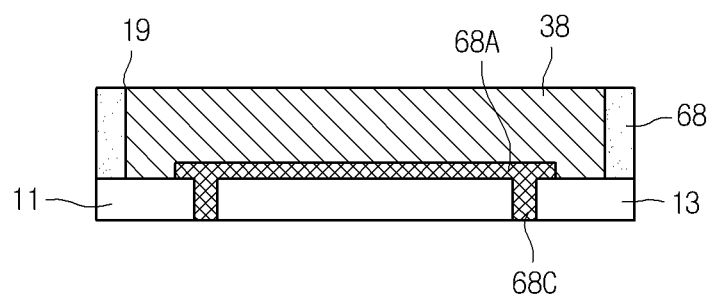

FIG. 53 is a plan view according to an embodiment. FIG. 54 is a sectional view taken along the line B-B of FIG. 53. FIG. 55 is a sectional view taken along the line C-C of FIG. 53.

Referring to FIGS. 53 to 55, a resin layer 68 is formed on an entire top side of first and second metal layers 11 and 13 and then a light emitting chip 45 is molded thereon. A groove 19 is formed around the resin layer 68. The groove 19 may be formed with a ring shape, a frame shape, or a polygonal shape and may expose the top side of the first metal layer 11 and may be spaced from the second metal layer 13. The etching method may include a wet or dry etching method and is not limited thereto.

A guide member 38 may be formed in the groove 19 and may be formed of a reflective material. The guide member 38 is disposed around the light emitting chip 45 with a circular or polygonal ring shape, contacts the first metal layer 11, and is spaced a predetermined distance T5 from the second metal layer. Therefore, the guide member 38 may not contact the lower sides 68A of the resin layer 68. Here, the lower sides 68A may be formed of a material of a resin layer or an insulation adhesive layer.

When the guide member 38 is embedded in the resin layer 68, it contacts the top side of the first metal layer 11 and is spaced from the second metal layer 13. Additionally, the guide member 38 may have heights which are different in the first metal layer 11 and the second metal layer 13. The guide member 38 may reflect a light emitted from the light emitting chip 45. This structure having no additional insulation film may be easily manufactured.

A portion 68C of the resin layer 68 may be filled in a separation part 17 between the first metal layer 11 and the second metal layer 13 or an insulation film may be attached to the top side or/and lower side of the metal layers.

The guide member 38 may have a wider upper width than a lower width. Additionally, the guide member 38 may have the inner side inclined at a predetermined angle with respect to the top sides of the metal layers 11 and 13.

Features of each embodiment may be selectively applied to other embodiments, and are not limited to a specific embodiment.

Here, if the guide member 38 is formed of a non-metallic material or insulation resin series, the groove 19 of the resin layer 68 extends to the top sides of the first and second metal layers 11 and 13 except the top side of the interface part of the two metal layers 11 and 12. The guide member 38 is formed in the groove 19.

At least one of the side, lower side, and to side of the plurality of metal layers according to embodiments may have an uneven structure. The uneven structure increases the surface area of the metal layer to improve heat radiation efficiency and adhesiveness with other materials.

<Light Emitting Chip>

A light emitting chip according to an embodiment will be described with reference to FIGS. 56 and 57.

Figure 56:
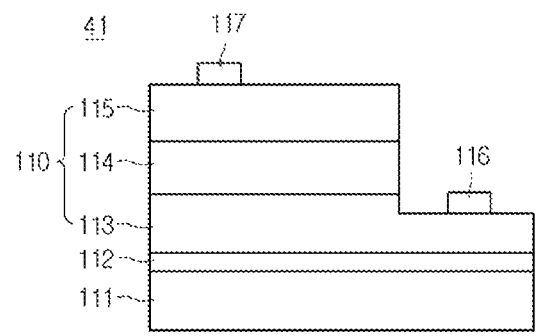
FIGS. 56 and 57 are views illustrating one example of a light emitting chip according to an embodiment.

Referring to FIG. 56, the light emitting chip 41 may include a substrate 111, a buffer layer 112, a first conductive semiconductor layer 113, an active layer 114, a second conductive semiconductor layer 115, a first electrode 116, and a second electrode. The first conductive semiconductor layer 113, the active layer 114, and the second conductive semiconductor layer 115 may define a light emitting structure.

The substrate 111 may include an $Al_2O_3$ substrate, a GaN substrate, a SiC substrate, a ZnO substrate, a Si substrate, a GaP substrate, an InP substrate, a conductive substrate, and a GaAs substrate. The substrate 111 may be a growth substrate. A semiconductor having the compositional formula of $In_xAl_yGa_{1-x-y}N$ ($0 \leq x \leq 1$, $0 \leq y \leq 1$, $0 \leq x+y \leq 1$) may be grown on the growth substrate.

The buffer layer 112 may alleviate a lattice constant difference between the substrate 111 and the semiconductor may be formed of a group II to VI compound semiconductor. An undoped Group III-V compound semiconductor layer may be further formed on the buffer layer 112 but is not limited thereto.

The first conductive semiconductor layer 113 is formed on the buffer layer 112, the active layer 124 is formed on the first conductive semiconductor layer 113, and the second conductive layer 115 is formed on the active layer 124.

The first conductive semiconductor layer 113 may be formed of one selected from compound semiconductors of a group III-V element doped with a first conducive dopant such as GaN, AlN, AlGaN, InGaN, InN, InAlGaN, AlInN, AlGaAs, GaP, GaAs, GaAsP, and AlGaInP. If the first conductive type is an N-type semiconductor, the first conductive dopant includes an N-type dopant such as Si, Ge, Sn, Se, and Te. The first conductive semiconductor layer 114 may be formed of a single layer or a multilayer and is not limited thereto.

The active layer 114 may have a single quantum well structure, a multi quantum well structure, a quantum wire structure, and a quantum dot structure. The active layer 114 may be formed with a period of a well layer and a barrier layer, for example, InGaN well layer/GaN barrier layer or InGaN well layer/AlGaN barrier layer, by using a compound semiconductor material of a group III-V element.

A conductive clad layer may be formed on or/and below the active layer 114 and may be formed of an AlGaN-based semiconductor.

The second conductive semiconductor layer 115 is formed on the active layer 114 and the second conductive semiconductor layer 115 may be formed of one from compound semiconductors of a group III-V element doped with a second conductive dopant such as GaN, AlN, AlGaN, InGaN, InN, InAlGaN, AlInN, AlGaAs, GaP, GaAs, GaAsP, and AlGaInP. If the second conductive type is a P-type dopant, the second conductive dopant may include a P-type dopant such as Mg and Ze. The second conductive semiconductor layer 115 may be formed of a single layer or a multilayer and is not limited thereto.

Moreover, a third conductive semiconductor layer, for example, an N-type semiconductor layer, may be formed on the second conductive semiconductor layer 115. The light emitting structure 135 may include one of N-P junction, P-N junction, N-P-N junction, P-N-P junction structures.

A current spreading layer may be formed on the second conductive semiconductor layer 115. The current spreading layer may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

A first electrode 116 may be formed on the first conductive semiconductor layer 113 and a second electrode 117 may be formed on the second conductive semiconductor layer 115.

The first electrode 116 and the second electrode 117 may be connected to the metal layers of FIG. 1 or 5 through a wire.

Figure 57:
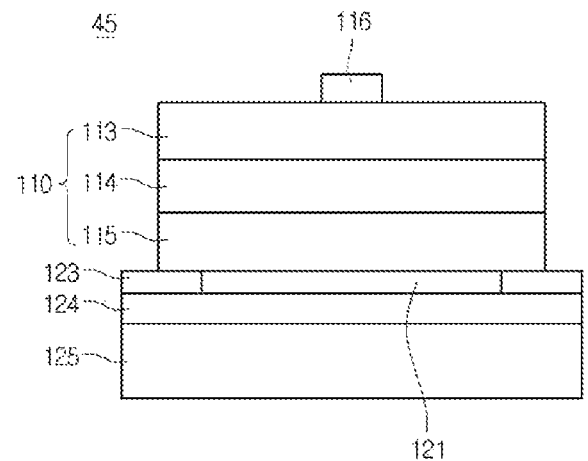

FIG. 57 is a vertical type chip structure.

Referring to FIG. 57, in relation to the light emitting chip 45, an ohmic layer 121 is formed below a light emitting structure 110, a reflective layer 124 is formed below the ohmic layer 121, a conductive supporting member 125 is formed below the reflective layer 124, and a protection layer 123 is formed around the reflective layer 124 and the light emitting structure 110.

The light emitting device 45 may be formed by forming an ohmic layer 121, a channel layer 123, a reflective layer 124, and a conductive supporting member 125 on the second conductive semiconductor layer 115 and then removing the substrate 111 and the buffer layer 112 without performing an etching process to expose the first conductive semiconductor layer 113 in the structure of FIG. 56.

The ohmic layer 121 may ohmic-contact the lower layer of the light emitting structure 110, for example, the second conductive semiconductor layer, and its material may be one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf and combinations thereof. The ohmic layer 121 may be formed of a multilayer using the metal material and a light-transmitting conductive material such as IZO, IZTO, IAZO, IGZO, IGTO, AZO, and ATO. For example, the multilayer may include IZO/Ni, AZO/Ag, IZO/Ag/Ni, and AZO/Ag/Ni. A layer for blocking a current corresponding to the electrode 16 may be further formed in the ohmic layer 121.

The protection layer 123 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protection layer 123 may be formed through a sputtering method or a deposition method. Metals in the reflective layer 124 may prevent an electrical short between the layers of the light emitting structure 110.

The reflective layer 124 may be formed of one of Ag, Ni, Al, Rh, Pd, Ir, Ru, Mg, Zn, Pt, Au, Hf, and combinations thereof. The reflective layer 124 may be formed with a wider width than the light emitting structure 110, thereby improving light reflection efficiency.

The conductive supporting member 125 is a base substrate and may be formed of Cu, Au, Ni, Mo, Cu—W, and a carrier wafer (for example, Si, Ge, GaAs, ZnO, and Sic). A bonding layer may be further formed between the conductive supporting member 125 and the reflective layer 124. The bonding layer may bond two layers.

The above-disclosed light emitting chip is just one example and is not limited to the above features. The light emitting chip may be selectively applied to the embodiments of the light emitting device, and is not limited thereto.

<Lighting System>

The light emitting devices of the above disclosed embodiments include packaged light emitting chips and are provided to a lightening system such as limit emitting module or a light unit with light emitting chips on a board. One of the light emitting devices according to the above embodiments may be applied to the lighting system The light emitting device according to the embodiment may be applied to a light unit. The light unit has a structure in which a plurality of light emitting devices or light emitting device packages are arrayed. The light unit may include the display device shown in FIGS. 58 and 59 and the lighting device shown in FIG. 11. Furthermore, the light unit may include illumination lamps, traffic lights, vehicle headlights, and signs.

Figure 58:
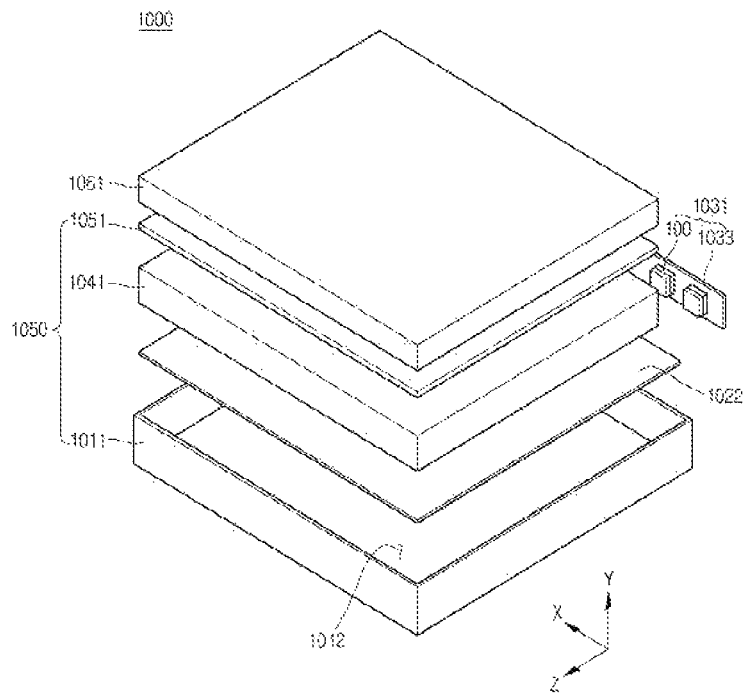
FIG. 58 is a perspective view illustrating one example of a display device according to an embodiment.

FIG. 58 is an exploded perspective view of a display device according to an embodiment.

Referring to FIG. 58, a display device 1000 according to an embodiment may include a light guide plate 1041, a light emitting module 1031 providing light to the light guide plate 1041, a reflective member 1022 disposed under the light guide plate 1041, an optical sheet 1051 disposed above the light guide plate 1041, a display panel 1061 disposed above the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as a light unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 may provide light to at least one side surface of the light guide plate 1041. Thus, the light emitting module 1031 may act as a light source of a display device.

At least one light emitting module 1031 may be disposed to directly or indirectly provide light to at least one side surface of the light guide plate 1041. The light emitting module 1031 may include a board 1033 and the light emitting device package 100 according to the above-described embodiment. The light emitting device package 100 may be arrayed on the board 1033 by a predetermined distance.

The board 1033 may be a printed circuit board (PCB) including a circuit pattern (not shown). Also, the substrate 1033 may include a general PCB, a metal core PCB, and a flexible PCB, but is not limited thereto. When the light emitting device package 100 are mounted on a side surface of the bottom cover 1011 or on a heatsink plate, the board 1033 may be removed. Here, a portion of the heatsink plate may contact a top surface of the bottom cover 1011.

The plurality of light emitting device packages 100 may be mounted on the board 1033 to allow a light emitting surface through which light is emitted from the board 1033 to be spaced a predetermined distance from the light guide plate 1041, but is not limited thereto. The light emitting device package 100 may directly or indirectly provide light to a light incident surface that is a side surface of the light guide plate 1041, but is not limited thereto.

The reflective member 1022 may be disposed under the light guide plate 1041. Since the reflective member 1022 reflects light incident onto an under surface of the light guide plate 1041 to supply the reflected light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and facing each other and a liquid crystal layer between the first and second boards. A polarizing plate may be attached to at least one surface of the display panel 1061. The present disclosure is not limited to the attached structure of the polarizing plate. The display panel 1061 displays information using light-transmitting the optical sheet 1051. The display device 1000 may be applied to various portable terminals, monitors for notebook computers, monitors for laptop computers, televisions, etc.

The optical sheet 1051 is disposed between the display panel 1061 and the light guide plate 1041 and includes at least one light-transmitting sheet. For example, the optical sheet 1051 may include at least one of a diffusion sheet, horizontal and vertical prism sheets, a brightness enhanced sheet, etc. The diffusion sheet diffuses incident light, and the horizontal or/and vertical prism sheet(s) collect(s) the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 59:
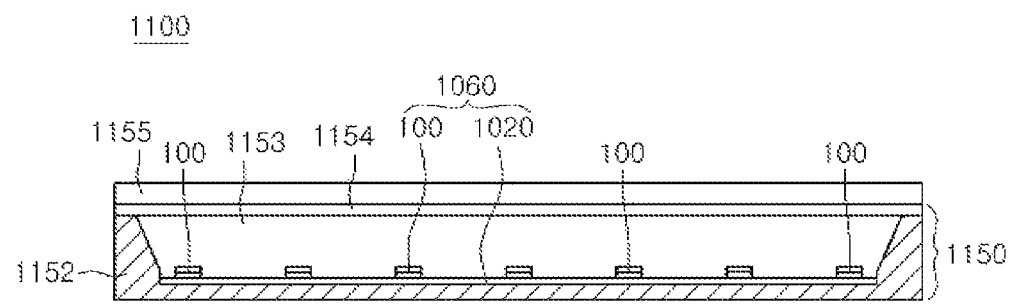
FIG. 59 is a perspective view illustrating another example of a display device according to an embodiment.

FIG. 59 is a view illustrating a display device according to an embodiment.

Referring to FIG. 59, a display device 1100 includes a bottom cover 1152, a board 1120 on which the above-described light emitting device packages 100 are arrayed, an optical member 1154, and a display panel 1155.

The board 1120 and the light emitting device package 100 may be defined as a light emitting module 1060. The bottom cover 1152, the at least one light emitting module 1060, and the optical member 1154 may be defined as a light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 60:
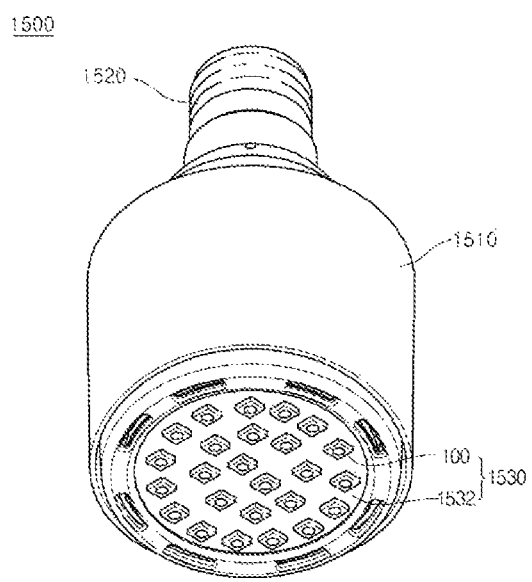
FIG. 60 is a view illustrating a lighting unit according to an embodiment.

FIG. 60 is a view of a lighting device according to an embodiment.

Referring to FIG. 60, a lighting unit 1500 may include a case 1510, a light emitting module 1530 in the case 1510, and a connection terminal 1520 disposed in the case 1510 to receive an electric power from an external power source.

The case 1510 may be preferably formed of a material having good heat dissipation characteristics, for example, a metal material or a resin material.

The light emitting module 1530 may include a board 1532 and a light emitting device package 100 mounted on the board 1532. The light emitting device package 100 may be provided in plurality, and the plurality of light emitting device packages 100 may be arrayed in a matrix form or spaced a predetermined distance from each other.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may be a coated layer having a white color or a silver color.

At least one light emitting device package 100 may be mounted on the board 1532. Each of the light emitting device packages 100 may include at least one light emitting diode (LED) chip. The LED chip may include a color LED emitting red, green, blue or white light, and a UV LED emitting ultraviolet (UV) rays.

The light emitting module 1530 may have a combination of various light emitting device packages 100 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screw-coupled to an external power source in a socket type, but is not limited thereto. For example, the connection terminal 1520 may be made in a pin type and inserted into the external power source or may be connected to the external power source through a wire.

The embodiments may provide a light emitting device of a tape type or a film type.

The embodiments provide a light emitting device supporting a metal layer through an insulation film not a package body. The embodiments may improve manufacturing processes of a light emitting device. The embodiments may reduce the thickness of a light emitting device. The embodiments may improve the miniaturization and integration of a light emitting device. The embodiments may improve heat radiation efficiency of a light emitting device and a lighting system including the same.

Features, structures, and effects described in the above embodiments are incorporated into at least one embodiment of the present invention, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A light emitting device, comprising:
   a plurality of metal layers spaced apart from each other;
   a first insulation film having an open area where a portion of top surface of the plurality of metal layers is open and disposed on a top surface of the plurality of metal layers;
   a semiconductor light emitting chip disposed on at least one of the plurality of metal layers and electrically connected to another of the plurality of metal layers;
   a resin layer disposed on the plurality of metal layers and the semiconductor light emitting chip;
   a first guide member of a metal material disposed on at least one of the first insulation film and the plurality of metal layers;
   a second insulation film on a top surface of the plurality of metal layers and corresponding to a position between the plurality of metal layers, the second insulation film having a width wider than an interval between the plurality of metal layers; and
   a second guide member on the second insulation film,
   wherein the first insulation film and the second insulation film are connected to each other and the first guide member and the second guide member are connected to each other,
   wherein lower surfaces of the plurality of metal layers are disposed on the same plane,
   wherein the plurality of metal layers include an inner part and an outer part and the outer part has a thicker thickness than that of the inner part,
   wherein the outer parts of the plurality of metal layers are physically separated from each other by the interval between the plurality of metal layers, and
   wherein the outer parts of the plurality of metal layers are formed of a metal material.

2. The light emitting device according to claim 1, wherein a thickness of the inner part of the plurality of metal layers is in a range of about 15 μm to about 300 μm.

3. The light emitting device according to claim 2, wherein the plurality of metal layers comprise a first metal layer, a second metal layer, and a third metal layer between the first metal layer and the second metal layer; and the light emitting chip is disposed on the third metal layer and is connected to the first metal layer and the second metal layer through a wire.

4. The light emitting device according to claim 3, wherein the first insulation film comprise at least one selected from the group consisting of a loop shape, a ring shape and a frame shape.

5. The light emitting device according to claim 4, wherein widths of the first and second guide member are narrower than those of the first and second insulation films.

\* \* \* \* \*